United States Patent
Takata et al.

(10) Patent No.: US 9,515,193 B2
(45) Date of Patent: Dec. 6, 2016

(54) METAL OXIDE FILM, METHOD FOR MANUFACTURING SAME, THIN FILM TRANSISTOR, DISPLAY APPARATUS, IMAGE SENSOR, AND X-RAY SENSOR

(71) Applicant: FUJIFILM Corporation, Tokyo (JP)

(72) Inventors: Masahiro Takata, Kanagawa (JP); Atsushi Tanaka, Kanagawa (JP); Masayuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/856,047

(22) Filed: Sep. 16, 2015

(65) Prior Publication Data

US 2016/0005879 A1   Jan. 7, 2016

Related U.S. Application Data

(63) Continuation of application No. PCT/JP2014/054363, filed on Feb. 24, 2014.

(30) Foreign Application Priority Data

Mar. 19, 2013  (JP) ................................. 2013-057281
Jan. 29, 2014  (JP) ................................. 2014-014679

(51) Int. Cl.
*H01L 29/10* (2006.01)
*H01L 29/786* (2006.01)
(Continued)

(52) U.S. Cl.
CPC ........... *H01L 29/7869* (2013.01); *C01G 15/00* (2013.01); *C01G 15/006* (2013.01);
(Continued)

(58) Field of Classification Search
CPC ........... H01L 29/7869; H01L 21/02422; H01L 21/02554; C01P 2002/74; C01P 2006/40; C01G 15/00; C01G 15/006
See application file for complete search history.

(56) References Cited

U.S. PATENT DOCUMENTS 9,117,663 B2 * 8/2015 Starostine ............. C23C 16/401
2006/0209529 A1   9/2006 Son et al.
(Continued)

FOREIGN PATENT DOCUMENTS

JP    4350745 B2    10/2009
JP    2010-182852 A    8/2010
(Continued)

OTHER PUBLICATIONS

Yong-Hoon Kim et al., "Flexible metal-oxide devices made by room-temperature photochemical activation of sol-gel films," Nature, Sep. 6, 2012, pp. 128-133, vol. 489.
(Continued)

*Primary Examiner* — Yosef Gebreyesus
(74) *Attorney, Agent, or Firm* — Sughrue Mion, PLLC

(57) ABSTRACT

Provided is a metal oxide film, including a component having a peak position, in an XPS spectrum thereof, within a range corresponding to a binding energy of from 402 eV to 405 eV, the metal oxide film satisfying a relationship represented by Equation (1): $A/(A+B) \geq 0.39$, when an intensity of peak energy attributed to nitrogen 1s electron is obtained by peak separation, and a manufacturing method of the same, an oxide semiconductor film, a thin-film transistor, a display apparatus, an image sensor, and an X-ray sensor. In Equation (1), A represents a peak area of the component having a peak position within a range corresponding to a binding energy of from 402 eV to 405 eV, and B represents a peak area of a component having a peak position within a range corresponding to a binding energy of from 406 eV to 408 eV.

11 Claims, 18 Drawing Sheets

(51) Int. Cl.
*H01L 21/02* (2006.01)
*H01L 29/66* (2006.01)
*C01G 15/00* (2006.01)
*H01L 29/24* (2006.01)

(52) U.S. Cl.
CPC .. *H01L 21/02422* (2013.01); *H01L 21/02554* (2013.01); *H01L 21/02565* (2013.01); *H01L 21/02614* (2013.01); *H01L 21/02628* (2013.01); *H01L 21/02664* (2013.01); *H01L 29/24* (2013.01); *H01L 29/66969* (2013.01); *C01P 2002/74* (2013.01); *C01P 2006/40* (2013.01)

(56) References Cited

U.S. PATENT DOCUMENTS

| | | | |
|---|---|---|---|
| 2007/0098902 A1* | 5/2007 | Engstrom | B05D 1/185 427/337 |
| 2007/0184576 A1* | 8/2007 | Chang | C23C 18/06 438/104 |
| 2010/0044694 A1* | 2/2010 | Son | H01B 1/08 257/40 |
| 2011/0227064 A1 | 9/2011 | Park et al. | |
| 2012/0235137 A1* | 9/2012 | Koezuka | H01L 29/7869 257/43 |
| 2012/0276452 A1* | 11/2012 | Yamauchi | H01M 4/364 429/218.1 |
| 2013/0058861 A1* | 3/2013 | Idem | B01J 23/10 423/651 |
| 2013/0059414 A1 | 3/2013 | Kim et al. | |

FOREIGN PATENT DOCUMENTS

| | | |
|---|---|---|
| JP | 2010-258057 A | 11/2010 |
| JP | 2011-199291 A | 10/2011 |
| JP | 2012-212874 A | 11/2012 |
| JP | 2012-228859 A | 11/2012 |
| WO | 2009/011224 A1 | 1/2009 |
| WO | 2009/031381 A1 | 3/2009 |
| WO | 2009/081862 A1 | 7/2009 |

OTHER PUBLICATIONS

International Search Report of PCT/JP2014/054363 dated May 20, 2014, 5 pages.
Written Opinion of the International Searching Authority of PCT/JP2014/054363 dated May 20, 2014, 17 pages.
Communication dated Jun. 21, 2016 from the Japanese Patent Office in counterpart Application No. 2014-014679.

* cited by examiner

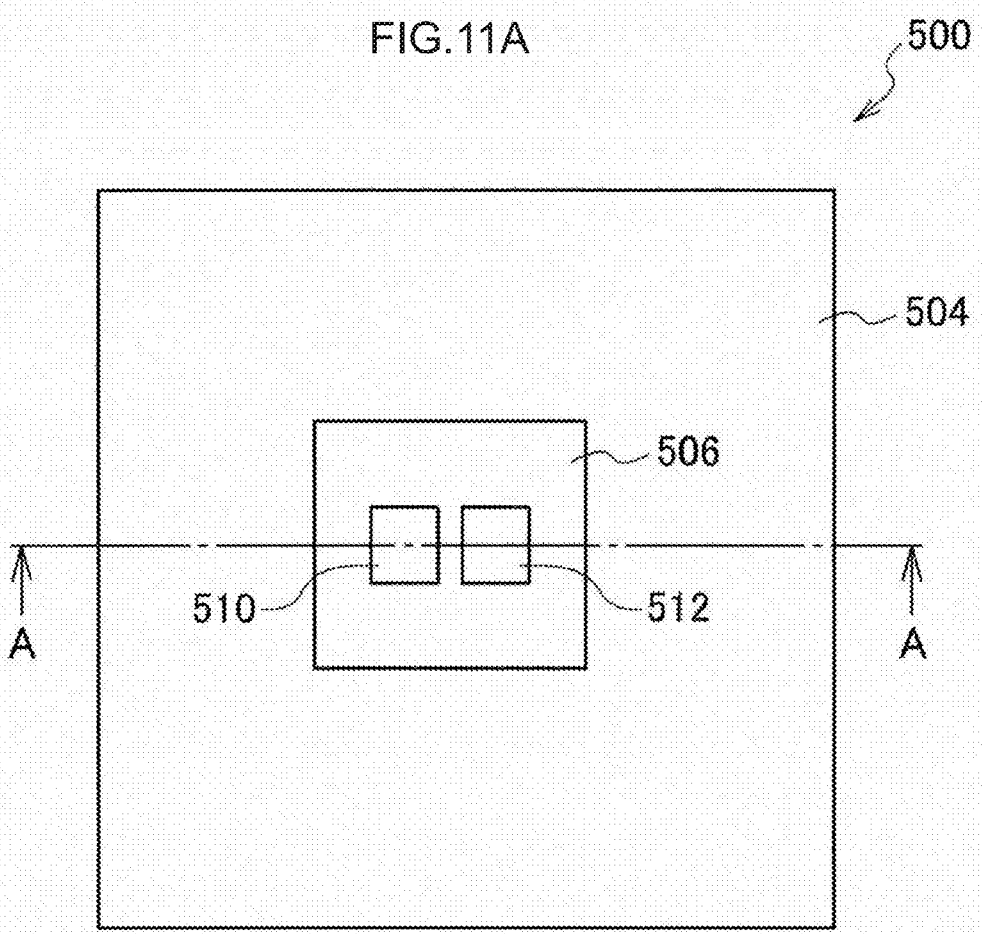
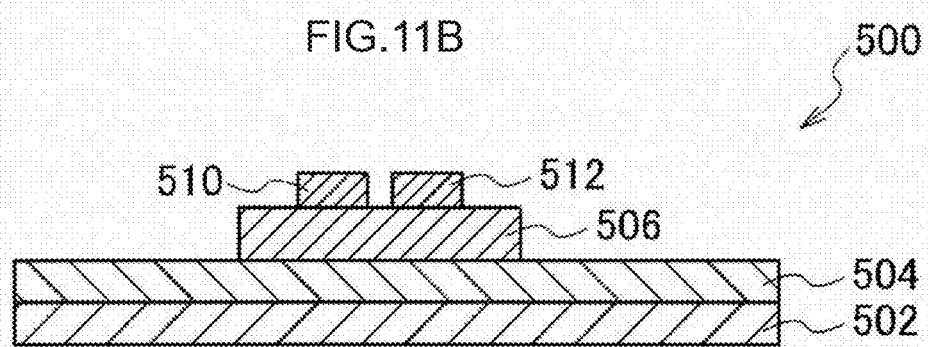

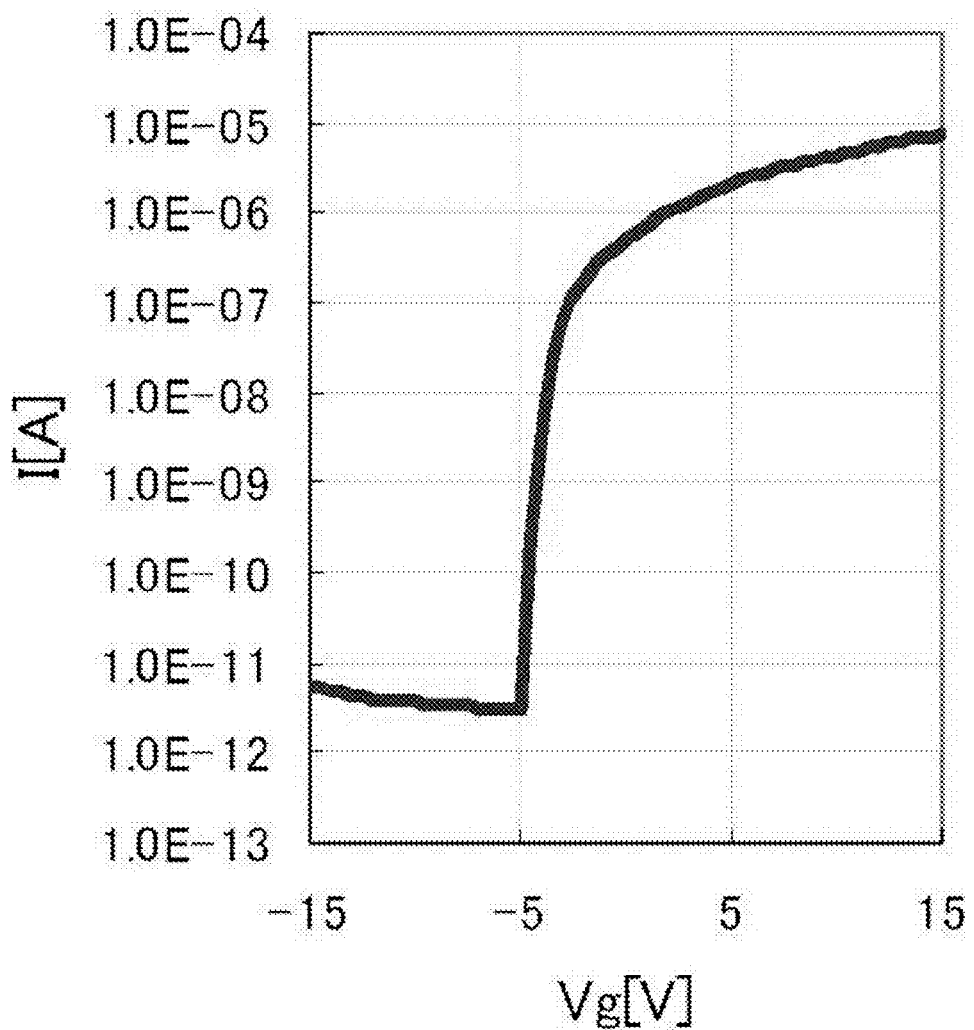

EXAMPLE 4: DRIED AT 100°C

METAL OXIDE FILM, METHOD FOR MANUFACTURING SAME, THIN FILM TRANSISTOR, DISPLAY APPARATUS, IMAGE SENSOR, AND X-RAY SENSOR

CROSS-REFERENCE TO RELATED APPLICATIONS

This application is a continuation application of International Application No. PCT/JP2014/054363, filed Feb. 24, 2014, the disclosure of which is incorporated herein by reference in its entirety. Further, this application claims priority from Japanese Patent Application No. 2013-057281, filed Mar. 19, 2013, and Japanese Patent Application No. 2014-014679, filed Jan. 29, 2014, the disclosures of which are incorporated herein by reference in their entirety.

TECHNICAL FIELD

The present invention relates to a metal oxide film and a method of manufacturing the same, a thin-film transistor, a display apparatus, an image sensor, and an X-ray sensor.

BACKGROUND ART

Implementation of metal oxide films as oxide semiconductor films or conductive oxide films has been put into practical use through manufacturing with vacuum film formation methods, and is currently attracting attention.

An active area of research and development relates to the fabrication of oxide semiconductor films via a liquid phase process, with an object of forming an oxide semiconductor film having excellent semiconductor characteristics, simply, at low temperature, and under atmospheric pressure. A technique including coating a solution onto a substrate and using ultraviolet radiation has recently been published in which a thin film transistor (TFT) having a high carrier mobility is obtained at a low temperature of 150° C. or less (see Nature, 489, p. 128 (2012)).

On the other hand, a technique has been described for forming an oxide semiconductor precursor film using a solution of inexpensive nitrates, acetates, or the like (see International Publication (WO) 2009/081862).

Moreover, a method of manufacturing an oxide semiconductor film by forming a precursor film for an oxide semiconductor using a solution of nitrates, acetates, or the like, and irradiating the precursor film with an electromagnetic wave in the presence of oxygen has been described (WO 2009/031381).

Moreover, a method of producing a metal oxide semiconductor has been described in which a thin film containing a precursor of a metal oxide semiconductor is formed by coating a solution including a nitrate or the like onto a substrate, subsequently heating the thin film to approximately 150° C. to allow the solvent to evaporate, and then irradiating the thin film with ultraviolet light in the presence of oxygen (see WO 2009/011224).

Moreover, a method of manufacturing a metal oxide semiconductor has been described in which a metal oxide semiconductor precursor film is formed by coating an aqueous metal oxide semiconductor precursor solution including a nitrate or the like onto a substrate, drying by evaporating the solvent at a temperature of from approximately 80° C. to approximately 100° C., and, after further heating to a temperature of from 50° C. to 200° C., converting the metal oxide semiconductor precursor film into a metal oxide semiconductor using an oxygen plasma method, a thermal oxidation method, a UV ozone method, or microwave heating (see Japanese Patent Application Laid-Open (JP-A) No. 2010-258057).

SUMMARY OF INVENTION

Technical Problem

However, the technique described in Nature, 489, p. 128 (2012), is disadvantageous in terms of increased labor and cost in solution synthesis, since the nitrate, acetate or the like is heated and stirred for 12 hours at 75° C. in a solvent to produce a metal methoxyethoxide. Moreover, hydrolysis is liable to occur in air due to the formation of an alkoxide, causing issues regarding stability.

Moreover, obtaining a uniform film thickness is difficult since the coating property of solutions that contain nitrates is poor, and variations in characteristics are liable to occur. In addition, obtaining high carrier mobility at low temperatures of 200° C. or lower is problematic.

WO 2009/031381 describes that the precursor film for an oxide semiconductor is irradiated with microwaves, and only the precursor film is heated to a high temperature. However, from the viewpoint of thermal conductivity, heating only the precursor film is exceedingly difficult for a film with a film thickness of 100 nm or less. Stable formation of oxide semiconductor films on a resin substrate having a poor heat resistance is therefore difficult.

In the method described in WO 2009/011224, a heating process is required between the drying process and the process of oxidizing via a UV ozone method in the presence of oxygen. A heating process is also required between the drying process and the conversion process in the method described in JP-A No. 2010-258057.

The present invention aims to provide a metal oxide film that is capable of being manufactured at a relatively low temperature and at atmospheric pressure, and a manufacturing method for the same, and an oxide semiconductor film, a thin-film transistor, a display apparatus, an image sensor, and an X-ray sensor.

Solution to Problem

In order to achieve the above object, the invention provides the following.
<1> A metal oxide film, comprising a component having a peak position, in an XPS spectrum of the metal oxide film, obtained by an X-ray photoelectron spectroscopy analysis, within a range corresponding to a binding energy of from 402 eV to 405 eV, the metal oxide film satisfying a relationship represented by the following Equation (1) when an intensity of a peak energy attributed to a nitrogen 1s electron is obtained by peak separation:

$$A/(A+B) \geq 0.39 \qquad \text{Equation (1)}$$

wherein, in Equation (1), A represents a peak area of the component having a peak position within a range corresponding to a binding energy of from 402 eV to 405 eV, and B represents a peak area of a component having a peak position within a range corresponding to a binding energy of from 406 eV to 408 eV.
<2> The metal oxide film according to <1>, which is a conductive oxide film.
<3> The metal oxide film according to <1>, which is an oxide semiconductor film.
<4> The metal oxide film according to any one of <1> to <3>, which satisfies a relationship represented by the following Equation (2) when the intensity of the peak energy attributed to a nitrogen 1s electron is obtained by peak separation in the XPS spectrum of the metal oxide film, obtained by an X-ray photoelectron spectroscopy analysis:

$$A/(A+B) \geq 0.73 \qquad \text{Equation (2)}$$

wherein, in Equation (2), A represents the peak area of the component having a peak position within a range corresponding to a binding energy of from 402 eV to 405 eV, and B represents the peak area of the component having a peak position within a range corresponding to a binding energy of from 406 eV to 408 eV.

<5> The metal oxide film according to any one of <1> to <4>, comprising indium.

<6> The metal oxide film according to <5>, comprising:
 indium; and
 at least one selected from the group consisting of Zn, Sn, Ga and Al.

<7> The metal oxide film according to <5> or <6>, wherein a content of indium is 50 atom % or higher with respect to a total content of metal elements included in the metal oxide film.

<8> A method of manufacturing an oxide semiconductor film, comprising:
 a precursor film forming process including applying a solution, that includes a nitrate, to a substrate to form a precursor film for an oxide semiconductor;
 a drying process of heating the substrate to a temperature of from 35° C. to 100° C. to dry the precursor film; and
 an oxide semiconductor film forming process of allowing the dried precursor film to absorb ultraviolet radiation so as to decompose the nitrate and form an oxide semiconductor film,
 wherein a maximum temperature reached by the substrate in the oxide semiconductor film forming process is 120° C. or higher.

<9> The method of manufacturing an oxide semiconductor film according to <8>, wherein the temperature of the substrate in the drying process is from 35° C. to 90° C.

<10> The method of manufacturing an oxide semiconductor film according to <8> or <9>, wherein the temperature of the substrate in the oxide semiconductor film forming process is 200° C. or lower.

<11> The method of manufacturing an oxide semiconductor film according to any one of <8> to <10>, wherein the oxide semiconductor film comprises a component having a peak position, in an XPS spectrum of the oxide semiconductor film, obtained by an X-ray photoelectron spectroscopy analysis, within a range corresponding to a binding energy of from 402 eV to 405 eV, and wherein a relationship represented by the following Equation (1) is satisfied when an intensity of a peak energy attributed to a nitrogen 1s electron is obtained by peak separation:

$$A/(A+B) \geq 0.39 \qquad \text{Equation (1)}$$

wherein, in Equation (1), A represents a peak area of the component having a peak position within a range corresponding to a binding energy of from 402 eV to 405 eV, and B represents a peak area of a component having a peak position within a range corresponding to a binding energy of from 406 eV to 408 eV.

<12> The method of manufacturing an oxide semiconductor film according to any one of <8> to <11>, wherein, in the oxide semiconductor film forming process, the precursor film is irradiated with ultraviolet radiation having a wavelength of 254 nm or lower, at an intensity of 10 mW/cm$^2$ or higher.

<13> The method of manufacturing an oxide semiconductor film according to any one of <8> to <12>, wherein the solution that includes a nitrate includes indium nitrate as the nitrate.

<14> The method of manufacturing an oxide semiconductor film according to <13>, wherein the solution that includes the indium nitrate further includes at least one metal component selected from the group consisting of Zn, Sn, Ga and Al.

<15> The method of manufacturing an oxide semiconductor film according to any one of <8> to <14>, wherein the oxide semiconductor film forming process is performed in a non-oxidative atmosphere.

<16> The method of manufacturing an oxide semiconductor film according to any one of <8> to <15>, wherein a light source for the ultraviolet radiation in the oxide semiconductor film forming process is a low pressure mercury lamp.

<17> The method of manufacturing an oxide semiconductor film according to any one of <8> to <16>, wherein the solution that includes the nitrate includes methanol or methoxyethanol.

<18> The method of manufacturing an oxide semiconductor film according to any one of <8> to <17>, wherein drying of the precursor film is started within 5 minutes after the precursor film forming process has been completed.

<19> The method of manufacturing an oxide semiconductor film according to any one of <8> to <18>, wherein a concentration of the nitrate in the solution that includes the nitrate is from 0.01 mol/L to 0.5 mol/L.

<20> The method of manufacturing an oxide semiconductor film according to any one of <8> to <19>, wherein, in the precursor film forming process, the solution that includes the nitrate is applied onto the substrate using at least one coating method selected from the group consisting of an inkjet method, a dispensing method, a relief printing method and an intaglio printing method, to form the precursor film.

<21> An oxide semiconductor film, which is manufactured by the method of manufacturing an oxide semiconductor film according to any one of <8> to <20>.

<22> A thin-film transistor, comprising:
 an active layer comprising an oxide semiconductor film selected from the group consisting of an oxide semiconductor film that is the metal oxide film according to any one of <1> or <3> to <7>, and the oxide semiconductor film according to <21>;
 a source electrode;
 a drain electrode;
 a gate insulating film; and
 a gate electrode.

<23> A display apparatus, comprising the thin-film transistor according to <22>.

<24> An image sensor, comprising the thin-film transistor according to <22>.

<25> An X-ray sensor, comprising the thin-film transistor according to <22>.

Advantageous Effects of Invention

The invention provides a metal oxide film that can be manufactured at a comparatively low temperature and at atmospheric pressure, and a manufacturing method for the same, and an oxide semiconductor film, a thin-film transistor, a display apparatus, an image sensor, and an X-ray sensor.

BRIEF DESCRIPTION OF DRAWINGS

FIG. 11A is a schematic plan view of a simplified TFT produced in examples and comparative examples.

FIG. 11B is a cross-section view taken along the line A-A of the simplified TFT illustrated in FIG. 11A.

FIG. 12 is a graph showing the $V_g$-$I_d$ characteristics of a TFT produced in Example 1.

DESCRIPTION OF EMBODIMENTS

Figure 1:
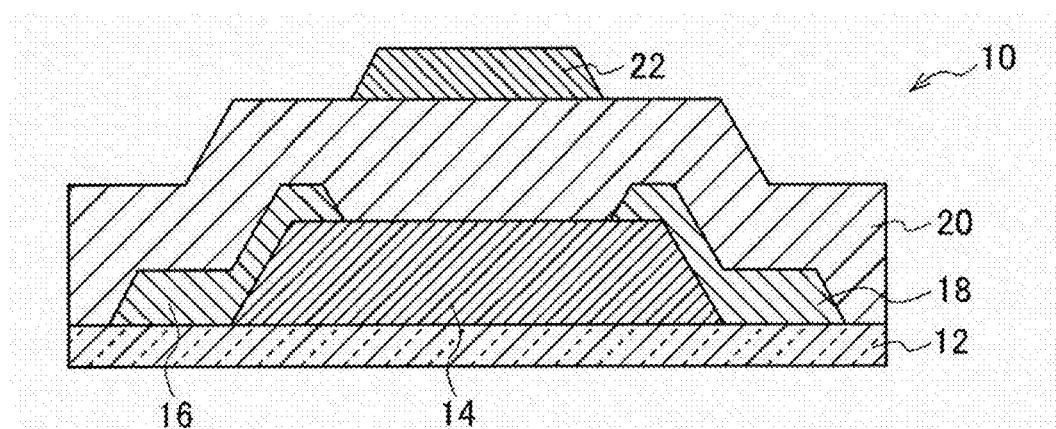
FIG. 1 is a schematic diagram illustrating a configuration of an example of a thin-film transistor (top-gate, top-contact type) produced according to the present invention.

Hereinbelow, specific explanation follows with reference to the accompanying drawings regarding a metal oxide film of the invention and a method for manufacturing the same, and regarding a thin-film transistor, a display apparatus, an X-ray sensor, and the like, which include the oxide semiconductor film manufactured according to the invention.

Note that members (configuration elements) having identical or corresponding functions are allocated the same reference numerals in the drawings, and explanation thereof is omitted where appropriate. Where numerical ranges are indicated by "to" in the present specification, the lower value and the upper value are included in the range.

Moreover, the metal oxide film of the invention is not limited to exhibiting electrical conductivity. The invention may be applied to manufacture of oxide semiconductor films, conductive oxide films, and oxide insulator films; however, explanation focuses on an oxide semiconductor film and a manufacturing method for the same as a typical example thereof.

The inventors of the present invention have discovered that uniform film formation is achieved by employing an appropriate drying process when forming an oxide semiconductor film using a nitrate solution of which coating property is poor and by which uniform film formation is problematic, and in particular that an oxide semiconductor film having excellent semiconductor characteristics is obtainable by selecting an appropriate processing temperature for the drying process, and allowing a precursor film for an oxide semiconductor to absorb ultraviolet radiation such that the nitrate decomposes. Namely, an oxide semiconductor film is obtained by: coating a substrate with a solution including a nitrate including a metal atom which is capable of constituting an oxide semiconductor film, to form an oxide semiconductor precursor film; then drying the precursor film at a temperature of from 35° C. to 100° C.; and irradiating the precursor film with ultraviolet radiation to allow the precursor to absorb the ultraviolet radiation, to decompose the bonds between the nitrates in the precursor film.

Method of Manufacturing Oxide Semiconductor Film

The method of manufacturing an oxide semiconductor film according to the invention includes: a precursor film forming process in which a solution including a nitrate is applied to a substrate to form a precursor film for an oxide semiconductor; a drying process in which the substrate is heated to a temperature of from 35° C. to 100° C. to dry the precursor film; and an oxide semiconductor film forming process in which the dried precursor film is allowed to absorb ultraviolet radiation such that the nitrate decomposes and an oxide semiconductor film is formed, in which the maximum temperature reached by the substrate in the oxide semiconductor film forming process is 120° C. or higher. Using the method of manufacturing an oxide semiconductor film of the invention enables an oxide semiconductor film to be obtained in which an XPS spectrum obtained by X-ray photoelectron spectroscopy analysis of the oxide semiconductor film includes a component having a peak position within a range corresponding to a binding energy of from 402 eV to 405 eV, and the relationship represented by the following Equation (1) is satisfied when the intensity of the peak energy attributed to a nitrogen 1s electron is obtained from peak separation.

$$A/(A+B) \geq 0.39 \quad (1)$$

In Equation (1), A represents the peak area of the component having the peak position within the range corresponding to a binding energy of from 402 eV to 405 eV, and B represents the peak area of a component having a peak position within a range corresponding to a binding energy of from 406 eV to 408 eV.

Specific explanation follows regarding each process. Note that although explanation focuses on a case in which the method of manufacturing an oxide semiconductor film of the invention is applied to the formation of a semiconductor layer (active layer) of a thin-film transistor, the method of manufacturing an oxide semiconductor film of the invention is not limited thereto.

Precursor Film Forming Process

First, a solution including a nitrate for forming an oxide semiconductor film, and a substrate, are prepared. A precursor film for an oxide semiconductor is then formed by applying the solvent including the nitrate to the substrate.

Substrate

The shape, structure, size, and the like of the substrate are not particularly limited, and these may be appropriately selected according to the purpose. The structure of the substrate may be a single layer structure, or may be a laminated structure.

The material constituting the substrate is not particularly limited, and an inorganic substrate such as glass or yttria-stabilized zirconia (YSZ), a resin substrate, a composite material thereof, or the like may be employed therefor. Of these, a resin substrate or a composite material is preferable from the viewpoint of being lightweight and the viewpoint of being flexible. Specifically, polybutylene terephthalate, polyethylene terephthalate, polyethylene naphthalate, polybutylene naphthalate, polystyrene, a polycarbonate, a polysulfone, polyethersulfone, a polyarylate, allyl diglycol carbonate, a polyamide, a polyimide, a polyamide-imide, a polyether imide, polybenzazole, polyphenylene sulfide, polycycloolefin, norbornene resin, a fluorine resin such as polychlorotrifluoroethylene, a liquid crystal polymer, an acrylic resin, an epoxy resin, a silicone resin, an ionomer resin, a cyanate resin, a cross-linked fumaric acid diester, a cyclic polyolefin, an aromatic ether, maleimide-olefin, cellulose, a synthetic resin substrate such as an episulfide compound, a composite plastic material with oxidized silicon particles, a composite plastic material with metal nanoparticles, inorganic oxide nanoparticles, inorganic nitride nanoparticles, or the like, a composite plastic material with carbon fibers or carbon nanotubes, a composite plastic material with glass flakes, glass fibers, or glass beads, a composite plastic material with particles having a clay mineral or mica derived crystal structure, a laminated plastic material having at least one bonding interface between thin glass and a singular organic material out of those above, a composite material having characteristics of a barrier having at least one bonding interface due to alternating layers of inorganic layers and organic layers, a stainless steel substrate or a multilayered metal substrate of layered stainless steel and another metal, an aluminum substrate or an aluminum substrate provided with an oxidized film that increases the insulator characteristics of the surface thereof by oxidation processing (for example, anodic oxidation) of the surface, or the like may be employed. Moreover, a resin substrate preferably has excellent heat resistance, dimensional stability, solvent resistance, electrical insulator characteristics, workability, low gas permeability, or low hygroscopicity. The resin substrate may be provided with a gas barrier layer for preventing permeation of moisture or oxygen, an undercoat layer for increasing the flatness of resin substrate or the adhesion of the resin substrate to a lower electrode, or the like.

Although not particularly limited, the thickness of the substrate employed in the invention is preferably from 50 μm to 500 μm. The flatness of the substrate itself is improved when the thickness of the substrate is 50 μm or more. Moreover, the flexibility of the substrate is improved when the thickness of the substrate is 500 μm or less, and the substrate is more easily employed as a flexible device substrate.

Solution Including Nitrate

The solution including a nitrate is obtained by weighing out a nitrate solute or the like including a metal atom which is capable of configuring an oxide semiconductor so as to give a solution having a desired nitrate concentration, stirring in a solvent, and allowing the nitrate solute to dissolve. The temperature at which stirring is performed and the stirring time are not particularly limited as long as the solute is able to sufficiently dissolve. The nitrate may be a hydrate.

The concentration of the nitrate in the solution including the nitrate may be selected according to the viscosity of the solvent, the desired film thickness, of the like. From the viewpoint of the flatness and ease of production of the film, the concentration is preferably from 0.01 mol/L to 0.5 mol/L, and is more preferably from 0.05 mol/L to 0.2 mol/L.

The solution including the nitrate may include another metal atom-containing compound according to the desired oxide semiconductor. Examples of metal atom-containing compound include metal salts other than nitrates, metal halide compounds, and organometallic compounds.

Examples of metal salts other than nitrates include sulfates, phosphates, carbonates, acetates, and oxalates. Examples of metal halide compounds include chlorides, iodides, and bromides. Examples of organometallic compounds include metal alkoxides, salts of organic acids, and metal β-diketonates.

The solution including the nitrate preferably contains indium nitrate as a nitrate. Employing indium nitrate enables ultraviolet light to be efficiently absorbed by the film during the oxide semiconductor film forming process performed later, enables an indium-containing oxide to be formed easily, and enables high electrical conductivity to be obtained.

The solution including the nitrate preferably contains at least one metal component selected from the group consisting of Zn, Sn, Ga, and Al, as a metal element other than indium. Including an appropriate amount of the above metal element(s) as a compound containing a metal atom other than indium in the solution including the nitrate enables the threshold voltage of the obtained oxide semiconductor film to be controlled at a desired value, and improves the electrical stability of the film. Examples of oxide semiconductors including indium and other metal element(s) include In—Ga—Zn—O, In—Zn—O, In—Ga—O, In—Sn—O, and In—Sn—Zn—O.

The solvent employed in the solution including the nitrate is not particularly limited as long as a solute such as the nitrate is capable of dissolving in the solvent. Examples of the solvent include water, alcohol solvents (such as methanol, ethanol, propanol, or ethylene glycol), amide solvents (such as N,N-dimethylformamide, or N,N-dimethylacetamide), ketone solvents (such as acetone, N-methylpyrrolidone, sulfolane, N,N-dimethyl imidazolidinone, or acetylacetone), ether solvents (such as tetrahydrofuran, or methoxyethanol), nitrile solvents (such as acetonitrile), and other heteroatom-containing solvents. In particular, from the viewpoints of solubility and coating property, methanol or methoxyethanol is preferably employed.

The method of applying the solution including the nitrate to the substrate to form a precursor film for an oxide semiconductor is not particularly limited. Examples thereof include a spray coating method, a spin coating method, a blade coating method, a dip coating method, a casting method, a roll coating method, a bar coating method, a die coating method, a mist method, an inkjet method, a dispensing method, a screen printing method, a relief printing method, and an intaglio printing method. In particular, from the viewpoint of easily forming minute patterns, preferably at least one application method is employed, selected from the group consisting of an inkjet method, a dispensing method, a relief printing method, and an intaglio printing method.

Drying Process

After the precursor film for an oxide semiconductor is formed on the substrate, the substrate is heated to a temperature of from 35° C. to 100° C. to dry the precursor film.

The drying process enables the fluidity of the applied film to be reduced, and enables the flatness of the finally-obtained oxide semiconductor film to be increased. Moreover, selecting an appropriate drying temperature (from 35° C. to 100° C.) enables an oxide semiconductor film having excellent semiconductor characteristics to be obtained.

The method of heat treatment in the drying process is not particularly limited, and the method of heat treatment may be selected from hot plate heating, electric furnace heating, infrared heating, microwave heating, and the like.

The drying process (heat treatment) is preferably started within 5 minutes after forming the precursor film for an oxide semiconductor. In a case in which the drying process is started within 5 minutes after forming the precursor film for an oxide semiconductor, the flatness of the film is capable of being kept substantially uniform.

The substrate temperature in the drying process is controlled so as to be from 35° C. to 100° C., and more preferably from 35° C. to 90° C. Setting the substrate temperature to 35° C. or higher enables the flatness of the film to be kept uniform. Setting the substrate temperature to 100° C. or lower, preferably to 90° C. or lower, enables an oxide semiconductor film having excellent semiconductor characteristics to be obtained more reliably.

Moreover, although not particularly limited, the duration of the heat treatment is preferably from 15 seconds to 10 minutes from the viewpoints of uniformity and ease of production of the film.

Although not particularly limited, the atmosphere in the drying process is preferably at atmospheric pressure, and the drying process is preferably performed in air, from the viewpoints such as manufacturing cost.

Oxide Semiconductor Film Forming Process

An oxide semiconductor film is formed by allowing the dried precursor film to absorb ultraviolet radiation such that the nitrate decomposes.

Ultraviolet Irradiation

Examples of light sources employed to irradiate the precursor film with ultraviolet radiation include UV lamps and lasers. However, UV lamps are preferable from the viewpoints of enabling uniform irradiation of a large surface area with ultraviolet radiation, and enabling a particularly high intensity of ultraviolet radiation to be obtained over a large surface area. Examples of UV lamps include excimer lamps, deuterium lamps, low pressure mercury lamps, high pressure mercury lamps, ultrahigh pressure mercury lamps, metal halide lamps, helium lamps, carbon arc lamps, cadmium lamps, and electrodeless discharge lamps. In particular, low pressure mercury lamps enable a high ultraviolet radiation intensity to be easily obtained and are therefore preferable.

In the oxide semiconductor film forming process, it is preferable that the precursor film surface is irradiated with ultraviolet light having a wavelength 254 nm or lower at an intensity of 10 mW/cm$^2$ or higher. When the intensity of the ultraviolet light having a wavelength 254 nm or lower is 10 mW/cm$^2$ or higher, an oxide semiconductor film having excellent semiconductor characteristics is obtained, and an oxide semiconductor film may be formed within a short time.

Employment of a UV ozone method is known as a method of oxidizing a precursor thin film for a metal oxide semiconductor using ultraviolet radiation (see WO 2009/011224). The UV ozone method is a method in which ozone is produced by irradiating with ultraviolet light in the presence of oxygen to thereby allow the oxygen to absorb the ultraviolet light, and the precursor thin film is oxidized by the action of activated oxygen, which is a powerful oxidant produced by decomposition of the ozone. In the UV ozone method, the production of ozone causes a reduction in the ultraviolet light intensity which irradiates the precursor film.

In contrast, the technique of forming an oxide semiconductor film from the precursor film according to the present invention is a method in which the oxide semiconductor film is formed by allowing ultraviolet radiation to be absorbed directly by the precursor film to decompose the nitrate, rather than the method in which the oxidation ability of activated oxygen is employed. Since the reduction in ultraviolet radiation intensity caused by generation of ozone is suppressed in the present method, in contrast to the UV ozone methods, treatment is possible using an inexpensive low intensity lamp, and the nitrate is capable of being more easily decomposed. From these viewpoints, it is preferable that the oxygen concentration in the atmosphere is low, and it is more preferable that the treatment is performed in a nonoxidative atmosphere such as a nitrogen atmosphere or an argon atmosphere.

The substrate temperature (the maximum temperature reached by the substrate during the ultraviolet radiation treatment; the same applies hereafter) during the ultraviolet radiation treatment (during ultraviolet irradiation treatment) is 120° C. or higher, and is preferably from 120° C. to 200° C. An oxide semiconductor film having excellent semiconductor characteristics is capable of being obtained when the substrate temperature is 120° C. or higher, and application to a resin substrate having a low heat resistance is capable of being easily made when the substrate temperature is 200° C. or lower. More specifically, since the ratio A/(A+B) in Equation (1) (A/(A+B)≥0.39) tends to increase when the substrate temperature in the ultraviolet radiation treatment is relatively high, the ratio A/(A+B) is adjustable by controlling the substrate temperature in the ultraviolet radiation treatment.

The substrate temperature in the ultraviolet radiation treatment may be controlled by, for example, adjusting the lamp output and the lamp-to-substrate distance. Moreover, the substrate temperature may be controlled using a heater or the like.

Although the ultraviolet irradiation duration depends on the intensity of ultraviolet radiation, the ultraviolet irradiation duration is preferably from 5 seconds to 120 minutes from the viewpoint of productivity.

Oxide Semiconductor Film

The oxide semiconductor film manufactured via the above-described processes is a film that includes an $NO_2$ component (nitrite ion and/or gaseous nitrous acid) in addition to the oxide semiconductor obtained by the decomposition of the nitrate by ultraviolet radiation. The inclusion of the $NO_2$ component in the oxide semiconductor film may be confirmed using an X-ray photoelectron spectroscopy (XPS) analysis of the film. Moreover, when an $NO_3$ component such as a nitrate ion is included in the oxide semiconductor film, this may also be confirmed by an XPS analysis. More specifically, in the XPS spectrum obtained using an XPS analysis, a component having a peak position in a range corresponding to a binding energy within a range of from 402 eV to 405 eV is observed when an $NO_2$ component is included, and a component having a peak position within a range corresponding to a binding energy of from 406 eV to 408 eV is observed when an $NO_3$ component is included (see *J. Phys. Chem. B*, 104, pp 319 (2000)).

According to the invention, it is capable of obtaining an oxide semiconductor film that satisfies the relationship represented by the following Equation (1) when the intensity of a peak energy attributed to a nitrogen 1s electron is obtained by peak separation in an XPS spectrum obtained using an X-ray photoelectron spectroscopy analysis of the oxide semiconductor film, and it is preferable that the oxide semiconductor film also satisfies the relationship represented by the following Equation (2).

$$A/(A+B) \geq 0.39 \qquad \text{Equation (1)}$$

$$A/(A+B) \geq 0.73 \qquad \text{Equation (2)}$$

In Equation (1) and Equation (2), A represents the peak area of a component having a peak position within a range corresponding to a binding energy of from 402 eV to 405 eV, and B represents the peak area of a component having a peak position within a range corresponding to a binding energy of from 406 eV to 408 eV.

The higher $A/(A+B)$, the higher the mobility obtained. $A/(A+B)$ may be controlled via the solution concentration and precursor film thickness in the precursor film forming process, the substrate temperature in the drying process, and the ultraviolet radiation intensity, substrate temperature, treatment duration, and the like in the oxide semiconductor film forming process. In particular, adjustment to the desired value may easily be made via the substrate temperature (the substrate temperature during the ultraviolet radiation treatment) in the oxide semiconductor film forming process, and the substrate temperature in the drying process.

The method of raising the value of $A/(A+B)$ is not particularly limited, and may be a method of decomposing the nitrate by a treatment other than the ultraviolet irradiation treatment, such as a plasma treatment. Setting the value of $A/(A+B)$ within the specific range stipulated above makes the oxide semiconductor film particularly useful for application as an active layer (oxide semiconductor layer) of a thin-film transistor mentioned below.

Thin-Film Transistor

Since the oxide semiconductor film produced according to an embodiment of the invention exhibits excellent semiconductor characteristics, the oxide semiconductor film is well suited for application to an active layer (oxide semiconductor layer) of a thin-film transistor (TFT). Explanation follows regarding an embodiment in a case in which the oxide semiconductor film produced by the manufacturing method of the invention is employed as an active layer of a thin-film transistor.

The TFT element structure according to the invention is not particularly limited, and based on the position of a gate electrode, the TFT element structure may be configured as either a so-called inversely staggered structure (also known as a bottom-gate type) or a staggered structure (also known as a top-gate type). Moreover, based on a portion where an active layer contacts a source electrode and a drain electrode (referred to as "source and drain electrodes" where appropriate), the TFT element structure may be configured as either a so-called top-contact type or a bottom-contact type.

A top-gate type is a configuration in which the substrate on which the TFT is formed is made the lowermost layer, and a gate electrode is disposed at the upper side of a gate insulating film and the active layer is formed at the lower side of the gate insulating film. A bottom-type is a configuration in which a gate electrode is disposed to the lower side of the gate insulating film, and the active layer is formed at the upper side of the gate insulating film. Moreover, a bottom-contact type is a configuration in which the source and drain electrodes are formed before the active layer, and a bottom face of the active layer is in contact with the source and drain electrodes. A top-contact type is a configuration in which, the active layer is formed before the source and drain electrodes, and a top face of the active layer is in contact with the source and drain electrodes.

FIG. 1 is a schematic diagram illustrating an example of a top-contact type TFT with a top-gate structure according to the invention. In a TFT 10 illustrated in FIG. 1, the oxide semiconductor film described above is layered as an active layer 14 onto one main face of the substrate 12. A source electrode 16 and a drain electrode 18 are disposed on the active layer 14, mutually separated, and a gate insulating layer 20 and a gate electrode 22 are further layered thereon in this order.

Figure 2:
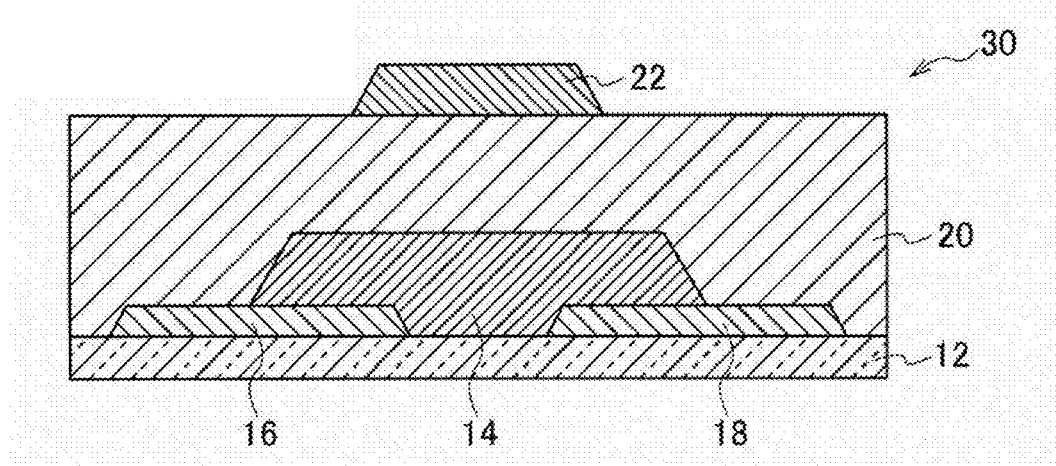
FIG. 2 is a schematic diagram illustrating a configuration of an example of a thin-film transistor (top-gate, bottom-contact type) produced according to the present invention.

FIG. 2 is a schematic diagram illustrating an example of a bottom-contact type TFT with a top gate structure according to the invention. In a TFT 30 illustrated in FIG. 2, the source electrode 16 and the drain electrode 18 are disposed on the one main face of the substrate 12, mutually separated. The oxide semiconductor film described above that serves as the active layer 14, the gate insulating layer 20, and the gate electrode 22 are layered in this order.

Figure 3:
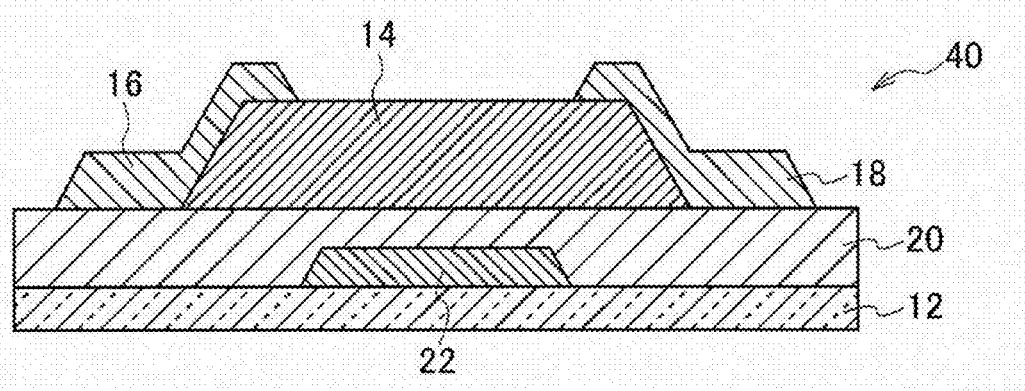
FIG. 3 is a schematic diagram illustrating a configuration of an example of a thin-film transistor (bottom-gate, top-contact type) produced according to the present invention.

FIG. 3 is a schematic diagram illustrating an example of a top-contact type TFT with a bottom-gate structure according to the invention. In a TFT 40 illustrated in FIG. 3, the gate electrode 22, the gate insulating layer 20, and the oxide semiconductor film described above that serves as the active layer 14 are layered onto the one main face of the substrate 12 in this order. The source electrode 16 and the drain electrode 18 are disposed on the surface of the active layer 14, mutually separated.

Figure 4:
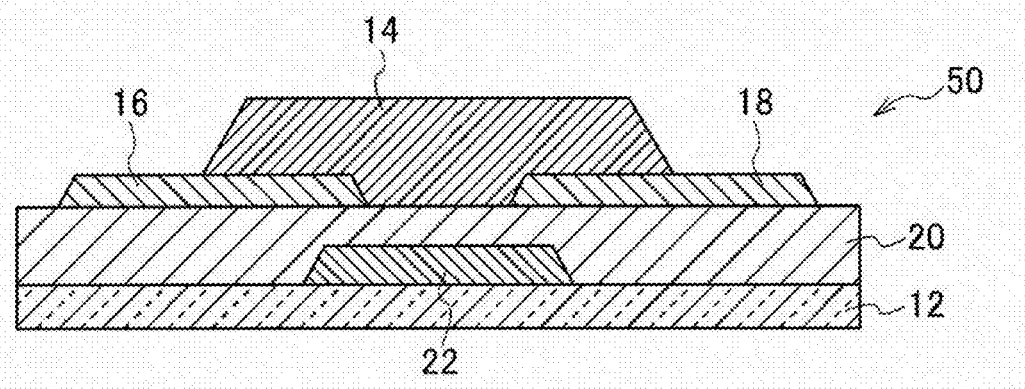
FIG. 4 is a schematic diagram illustrating a configuration of an example of a thin-film transistor (bottom-gate, bottom-contact type) produced according to the present invention.

FIG. 4 is a schematic diagram illustrating an example of a bottom-contact type TFT with a bottom-gate structure according to the invention. In a TFT 50 illustrated in FIG. 4, the gate electrode 22 and the gate insulating layer 20 are layered onto the one main face of the substrate 12 in this order. The source electrode 16 and the drain electrode 18 are disposed on the surface of the gate insulating layer 20 so as to be separated from each other, and the oxide semiconductor film described above that serves as the active layer 14 is layered thereon.

The explanation of the embodiment hereinbelow focuses on the top-gate type thin-film transistor 10 illustrated in FIG. 1. However, the thin-film transistor of the invention is not limited to a top-gate type, and may be a bottom-gate type thin-film transistor.

Active Layer

When the thin-film transistor 10 of the present embodiment is to be manufactured, first, the oxide semiconductor film is formed on a substrate 12 via the precursor film forming process, the drying process, and the oxide semiconductor film forming process described above. The patterning of the oxide semiconductor film may be performed before the oxide semiconductor film forming process, using an inkjet method, a dispensing method, a relief printing method, or an intaglio printing method as mentioned above, or may be performed after the oxide semiconductor film forming process, using photolithography and etching. When employing a method in which a pattern is formed directly, prior to the oxide semiconductor film forming process, using an inkjet method or the like, there is no need to perform photolithography and etching processes, and this is preferable since process costs are capable of being reduced.

In pattern formation by photolithography and etching, after a resist pattern is formed using photolithography on a portion that will remain as the active layer 14, the pattern of the active layer 14 is formed by etching using an acid solution such as hydrochloric acid, nitric acid, dilute sulfuric acid, or a mixed solution of phosphoric acid, nitric acid and acetic acid.

From the viewpoints of the flatness of the film, elimination of unnecessary components from the film, and efficiently decomposing the nitrate using ultraviolet irradiation, the thickness of the active layer 14 is preferably from 5 nm to 40 nm, and is more preferably from 5 nm to 20 nm.

From the viewpoint of obtaining high mobility, the content of indium in the active layer 14 is preferably 50 atom % or higher, and is more preferably 80 atom % or higher, with respect to the total number of atoms of metal elements included in the active layer 14.

Protective Layer

A protective layer (not illustrated in the diagrams) that protects the active layer 14 during etching of the source and drain electrodes 16, 18 is preferably formed on the active layer 14. The film formation method of the protective layer is not particularly limited, and film formation may be performed prior to the oxide semiconductor film forming process, or film formation may be performed after the oxide semiconductor film forming process. Moreover, the protective layer may be formed prior to, or may be formed after, patterning of the active layer 14.

A metal oxide layer, or an organic material such as a resin, may serve as the protective layer. The protective layer may be removed after formation of the source electrode 15 and the drain electrode 18 (referred to as the "source and drain electrodes" where appropriate).

Source and Drain Electrodes

The source and drain electrodes 16, 18 are formed on the active layer 14. The source and drain electrodes 16, 18 both employ a material having a high electrical conductivity so as to function as electrodes, and may be formed using, for example, a metal such as Al, Mo, Cr, Ta, Ti, Ag, or Au, or an electrically conductive metal oxide film such as Al—Nd, an Ag alloy, tin oxide, zinc oxide, indium oxide, indium tin oxide (ITO), indium zinc oxide (IZO), or In—Ga—Zn—O.

When the source and drain electrodes 16, 18 are to be formed, film formation may be performed according to a method appropriately selected, in consideration of the suitability of the employed material, from a wet method such as a printing method or a coating method, a physical method such as a vacuum vapor deposition method, a sputtering method, or an ion plating method, a chemical method such as CVD or a plasma CVD method, and the like.

In consideration of film formability, patternability by etching or a lift-off method, electrical conductivity, and the like, the film thickness of the source or drain electrodes 16, 18 is preferably from 10 nm to 1,000 nm, and more preferably from 50 nm to 100 nm.

After forming the conductive film, the source and drain electrodes 16, 18 may, for example, be formed with a specific patterning shape using etching or a lift-off method, or may be directly formed with a pattern using an inkjet method or the like. In this case, the source and drain electrodes 16, 18 and the wiring lines connected to these electrodes (not illustrated in the diagrams) are preferably patterned simultaneously.

Gate Insulating Film

A gate insulating film 20 is formed after forming the source and drain electrodes 16, 18 and the wiring (not illustrated in the drawings). The gate insulating film 20 preferably has excellent insulating characteristics, and may be an insulating layer of, for example, $SiO_2$, $SiN_x$, SiON, $Al_2O_3$, $Y_2O_3$, $Ta_2O_5$, or $HfO_2$, or an insulating layer that includes two or more of these compounds.

Formation of the gate insulating film 20 may be performed according to a method appropriately selected, in consideration of the suitability of the employed material, from a wet method such as a printing method or a coating method, a physical method such as vacuum vapor deposition, a sputtering method, or an ion plating method, a chemical method such as CVD or a plasma CVD method, and the like.

Note that although the gate insulating film 20 is required to have such a thickness that leak current is reduced and voltage resistance is improved, setting the thickness of the gate insulating film 20 too large leads to an increase in drive voltage. Although it depends on the type of the material of the gate insulating film 20, the thickness of the gate insulating film 20 is preferably from 10 nm to 10 µm, is more preferably from 50 nm to 1,000 nm, and is particularly preferably from 100 nm to 400 nm.

Gate Electrode

A gate electrode 22 is formed after forming the gate insulating film 20. The gate electrode 22 employs a material having a high electrical conductivity, and may, for example, be formed using a metal such as Al, Mo, Cr, Ta, Ti, Ag, or Au, or an electrically conductive metal oxide film such as Al—Nd, an Ag alloy, tin oxide, zinc oxide, indium oxide, indium tin oxide (ITO), indium zinc oxide (IZO), or IGZO. As the gate electrode 22, these electrically conductive films may be employed in a single layer structure, or in a layered structure of two or more layers.

The gate electrode 22 may be formed as a film according to a method appropriately selected, in consideration of the suitability of the employed material, from a wet method such as a printing method or a coating method, a physical method such as vacuum vapor deposition, a sputtering method, or an ion plating method, a chemical method such as CVD and a plasma CVD method, and the like.

The film thickness of the metal film that forms the gate electrode 22 is preferably from 10 nm to 1,000 nm, and is more preferably from 50 nm to 200 nm, in consideration of film formability, patternability by etching or a lift-off method, and electrical conductivity.

After film formation, the gate electrode 22 may be formed by patterning in a specific shape using etching or a lift-off method, or may be directly formed with a pattern directly using an inkjet method or the like. In this case, the gate electrode 22 and the gate lines (not illustrating in the drawings) are preferably patterned simultaneously.

The thin-film transistor 10 of the present embodiment explained above is not particularly limited in terms of application, and due to having high carrier mobility, is suited to production of drive elements in display apparatuses such as liquid crystal display apparatuses, organic electro luminescence (EL) display apparatuses, and inorganic EL display apparatuses, and flexible displays that employ resin substrates having a low temperature resistance.

Moreover, the thin-film transistor manufactured using the invention is suited to employment in various types of sensors such as an X-ray sensor or an imaging sensor, or as a drive element (drive circuit) in various electronic devices such as a microelectromechanical system (MEMS).

Liquid Crystal Display Apparatus

Figure 5:
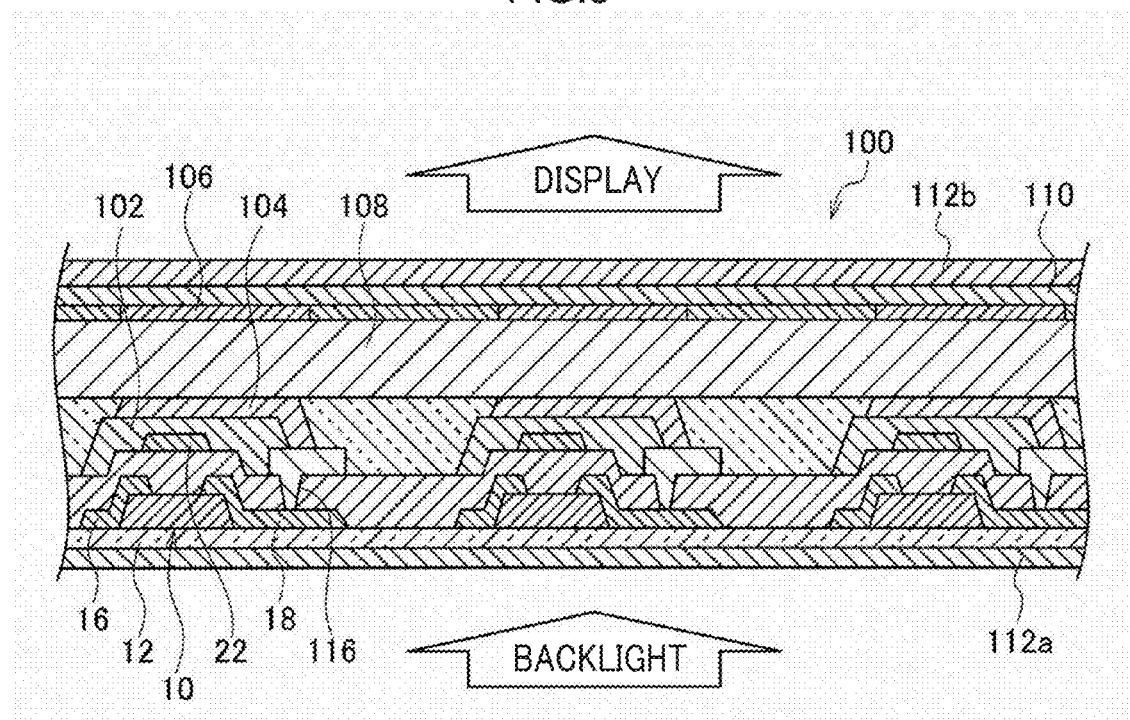
FIG. 5 is a schematic cross-section view illustrating a portion of a liquid crystal display apparatus according to an embodiment.
Figure 6:
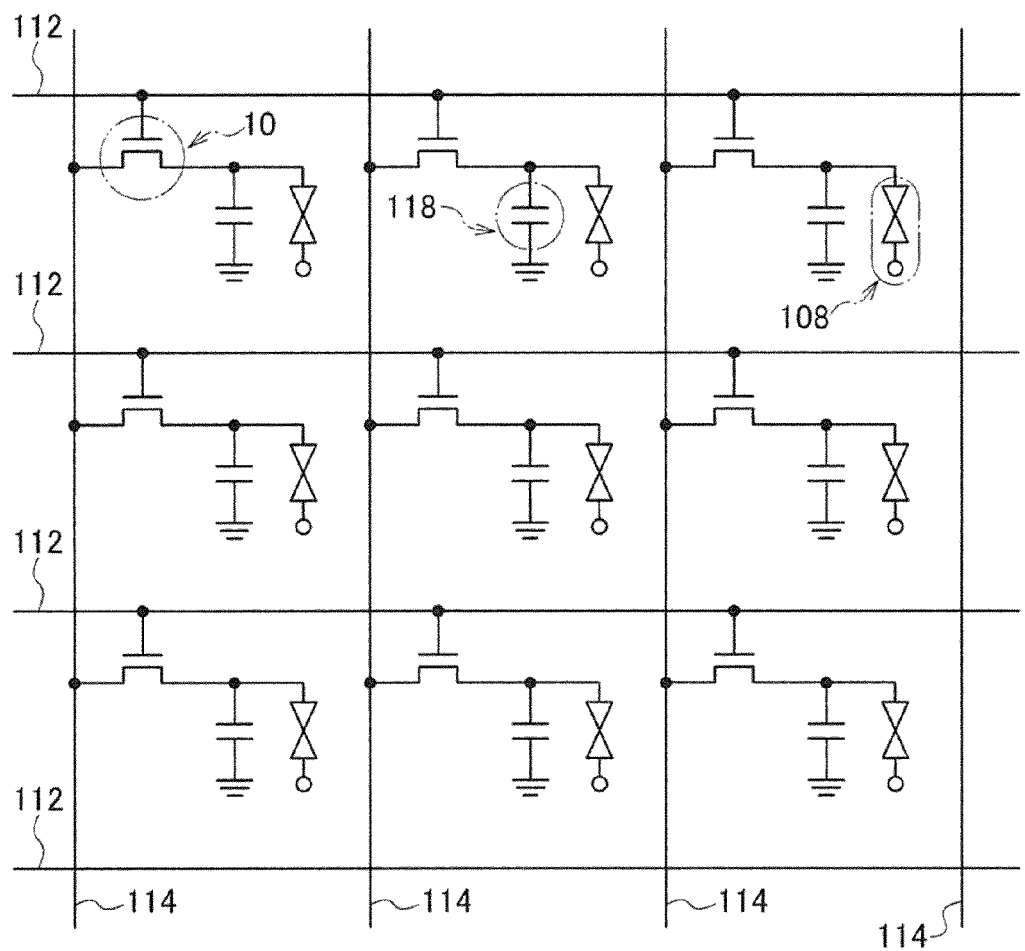
FIG. 6 is a schematic configuration diagram of electrical wiring in the liquid crystal display apparatus of FIG. 5.

FIG. 5 is a schematic cross-section of a portion of a liquid crystal display apparatus that is an embodiment of the invention, and FIG. 6 is a schematic configuration diagram of electrical wiring thereof.

As illustrated in FIG. 5, a liquid crystal display apparatus 100 of the present embodiment is configured by including a top-contact type TFT 10 with a top-gate structure illustrated in FIG. 1, a liquid crystal layer 108 interposed between a pixel lower electrode 104 and an upper electrode 106 opposite thereto that are above the gate electrode 22 that is protected by a passivation layer 102 of the TFT 10, and an R (red) G (green) B (blue) color filter 110 that produce different colors corresponding to respective pixels. Moreover, polarizing plates 112a, 112b are provided at the substrate 12 side of the TFT 10 and above the RGB color filter 110, respectively.

As illustrated in FIG. 6, the liquid crystal display apparatus 100 of the present embodiment includes plural gate lines 112 parallel to one another, and data lines 114 that are parallel to one another and that intersect the gate lines 112. The gate lines 112 and the data lines 114 are electrically insulated from each other. The TFTs 10 are provided in the vicinity of the intersections between the gate lines 112 and the data lines 114.

The gate electrode 22 of each TFT 10 is connected to the respective gate line 112, and the source electrode 16 of each TFT 10 is connected to the respective data line 114. The drain electrode 18 of each TFT 10 is connected to the pixel lower electrode 104 through a contact hole 116 provided to the gate insulating film 20 (a conductor is embedded in the contact hole 116). The pixel lower electrode 104, and the upper electrode 106 that is opposite thereto and that is connected to ground, configure a capacitor 118.

Organic EL Display Apparatus

Figure 7:
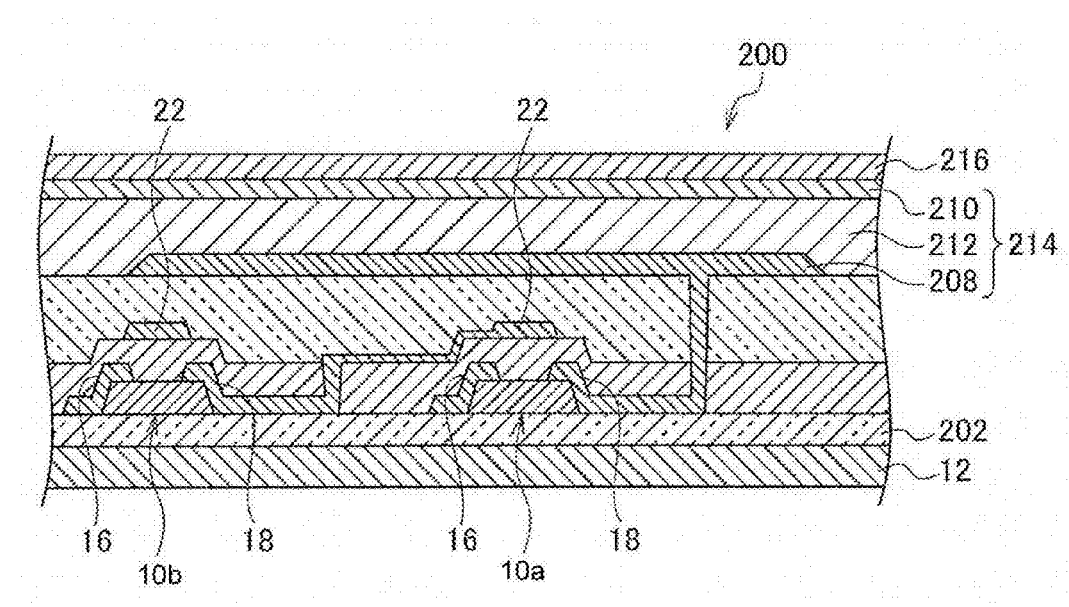
FIG. 7 is a schematic cross-section view illustrating a portion of an organic EL display apparatus according to an embodiment.
Figure 8:
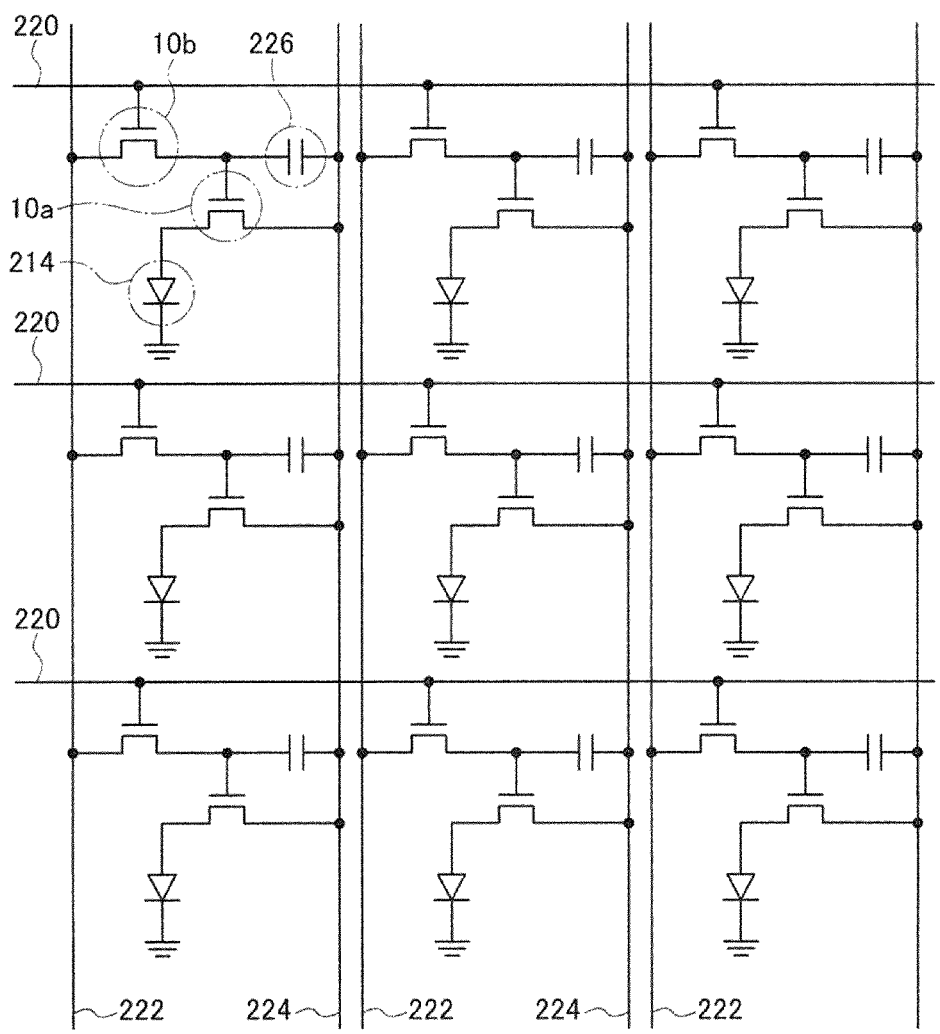
FIG. 8 is a schematic configuration diagram of electrical wiring in the organic EL display apparatus of FIG. 7.

FIG. 7 is a schematic cross-section of a portion of an active matrix-type organic EL display apparatus according to an embodiment of the invention, and FIG. 8 is a schematic configuration diagram illustrating electrical wiring thereof.

In an active matrix-type organic EL display apparatus 200 of the present embodiment, a TFT 10 having a top-gate structure illustrated in FIG. 1 is provided on the substrate 12 that is provided with a passivation layer 202, to serve as both drive TFTs 10a and switching TFTs 10b. Configuration is made such that an organic EL light emitting element 214, formed from an organic luminescent layer 212 interposed between a lower electrode 208 and an upper electrode 210, is provided above the TFTs 10a, 10b, and an upper face of the organic EL light emitting element 214 is protected by a passivation layer 216.

As illustrated in FIG. 8, the organic EL display apparatus 200 of present embodiment is provided with plural gate lines 220 parallel to one another, and data lines 222 and drive lines 224 that are parallel to one another, and that intersect the gate lines 220. The gate lines 220 are insulated from the data lines 222 and the drive lines 224. The gate electrodes 22 of the switching TFTs 10b are connected to the gate lines 220, and the source electrodes 16 of the switching TFTs 10b are connected to the data lines 222. The drain electrodes 18 of the switching TFTs 10b are connected to the gate electrodes 22 of the drive TFTs 10a, and capacitors 226 are used to hold each drive TFT 10a in an ON state. The source electrodes 16 of the drive TFTs 10a are connected to the drive lines 224, and the drain electrodes 18 are connected to the organic EL light emitting elements 214.

The organic EL display apparatus illustrated in FIG. 7 may be configured as a top emission type by configuring the upper electrode 210 as a transparent electrode, or may be configured as a bottom emission type by configuring the lower electrode 208 and each electrode of the TFTs as transparent electrodes.

X-Ray Sensor

Figure 9:
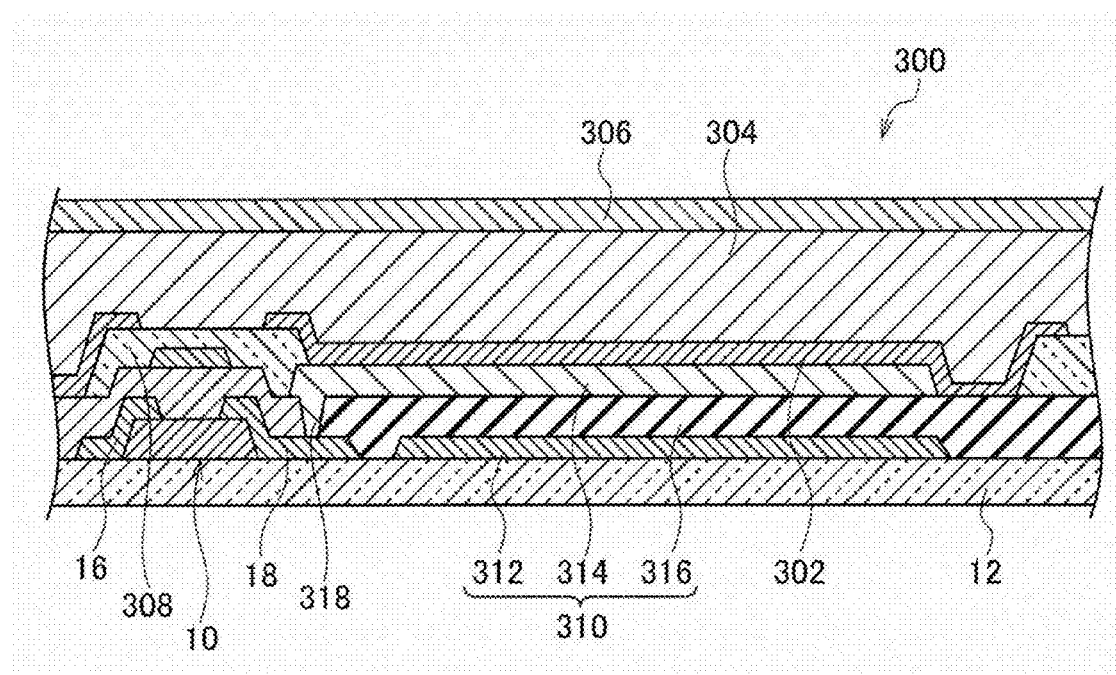
FIG. 9 is a schematic cross-section view illustrating a portion of an X-ray sensor array according to an embodiment.
Figure 10:
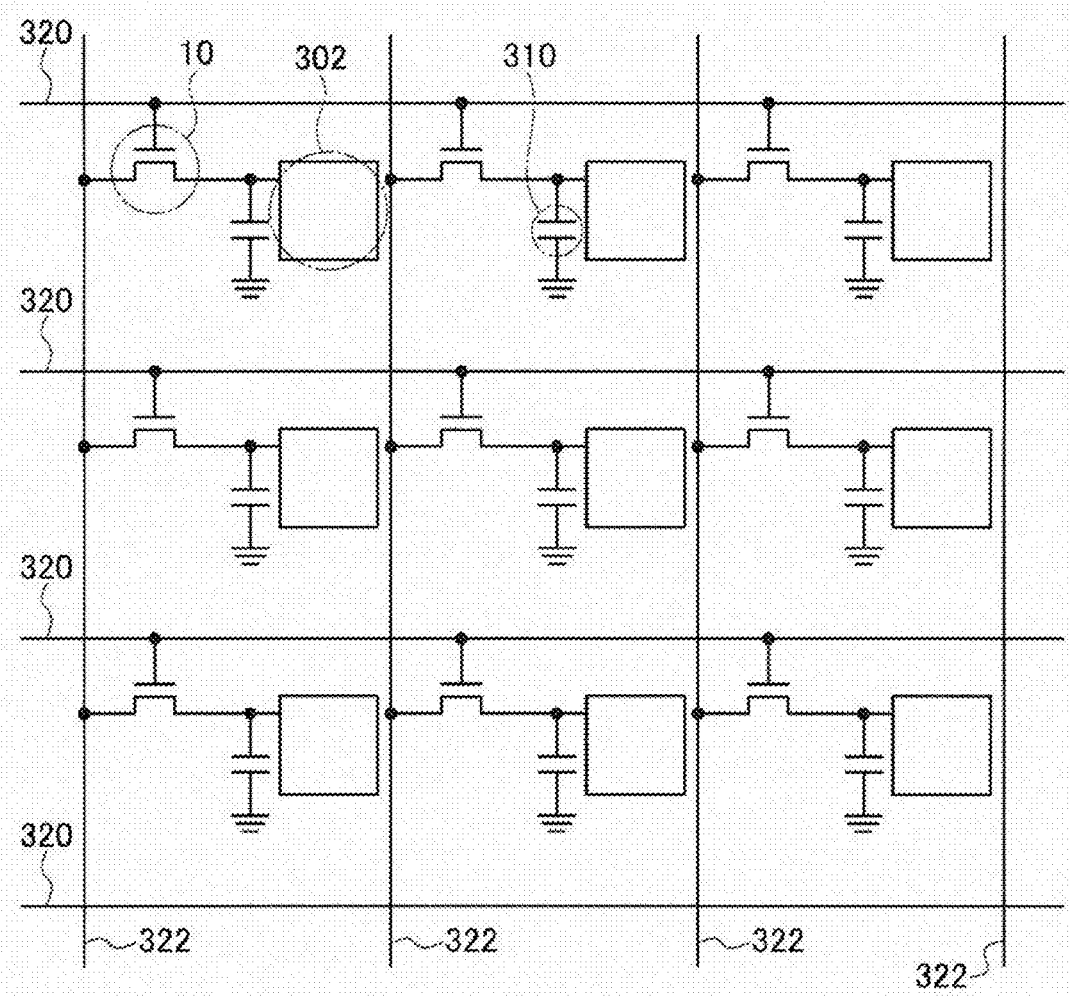
FIG. 10 is a schematic configuration diagram of electrical wiring in the X-ray sensor array of FIG. 9.
Figure 13:
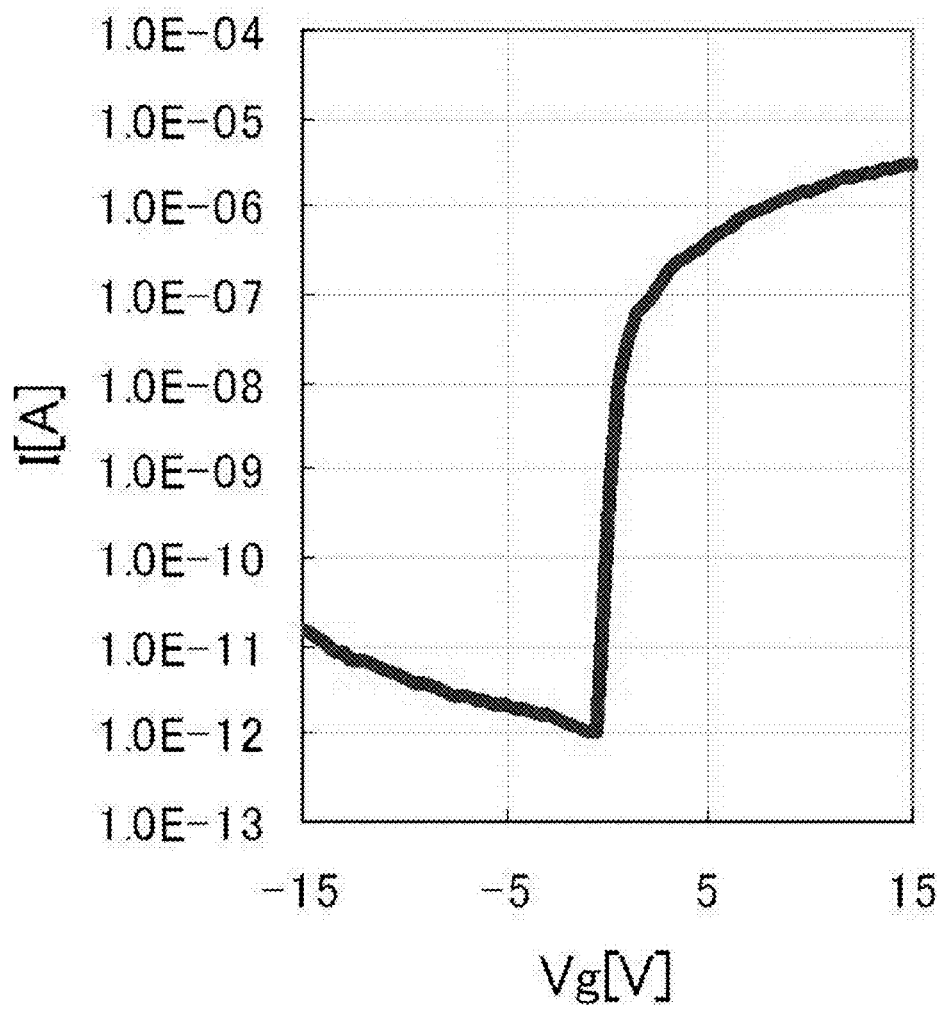
FIG. 13 is a graph showing the $V_g$-$I_d$ characteristics of a TFT produced in Example 2.
Figure 14:
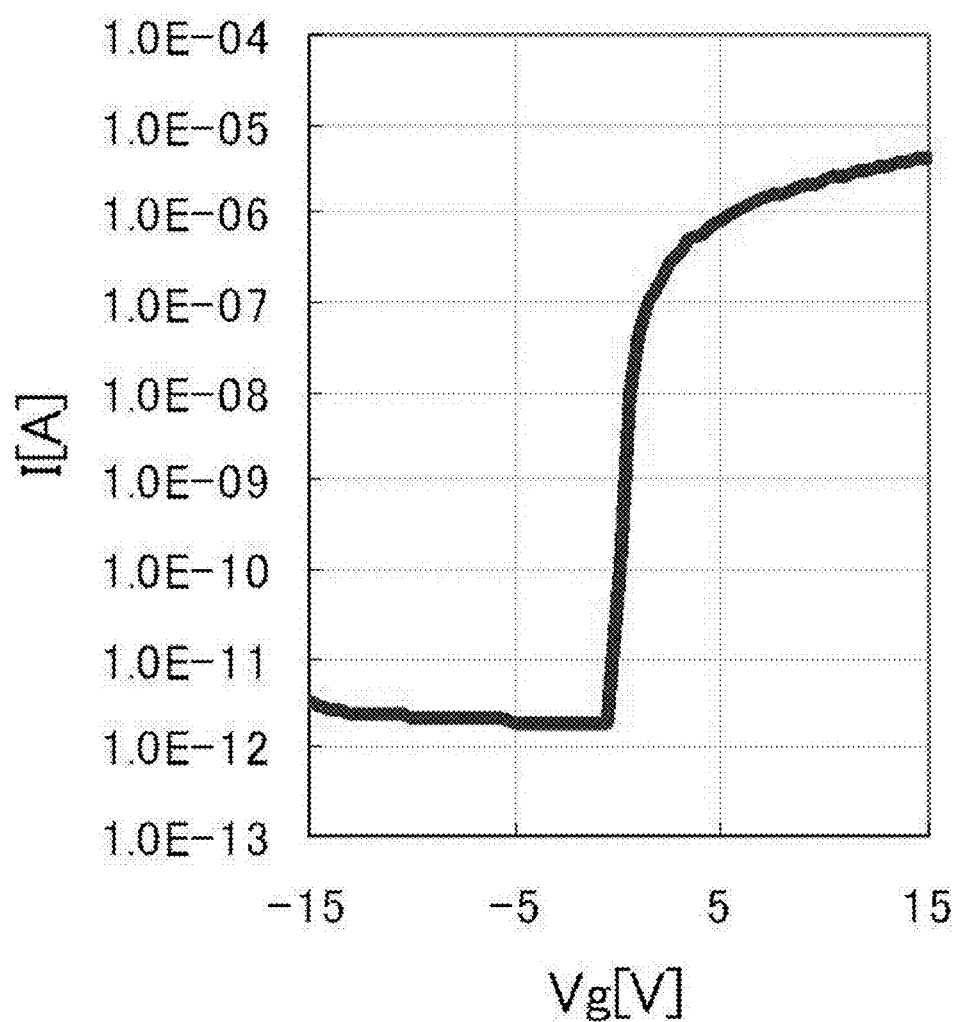
FIG. 14 is a graph showing the $V_g$-$I_d$ characteristics of a TFT produced in Example 3.
Figure 15:
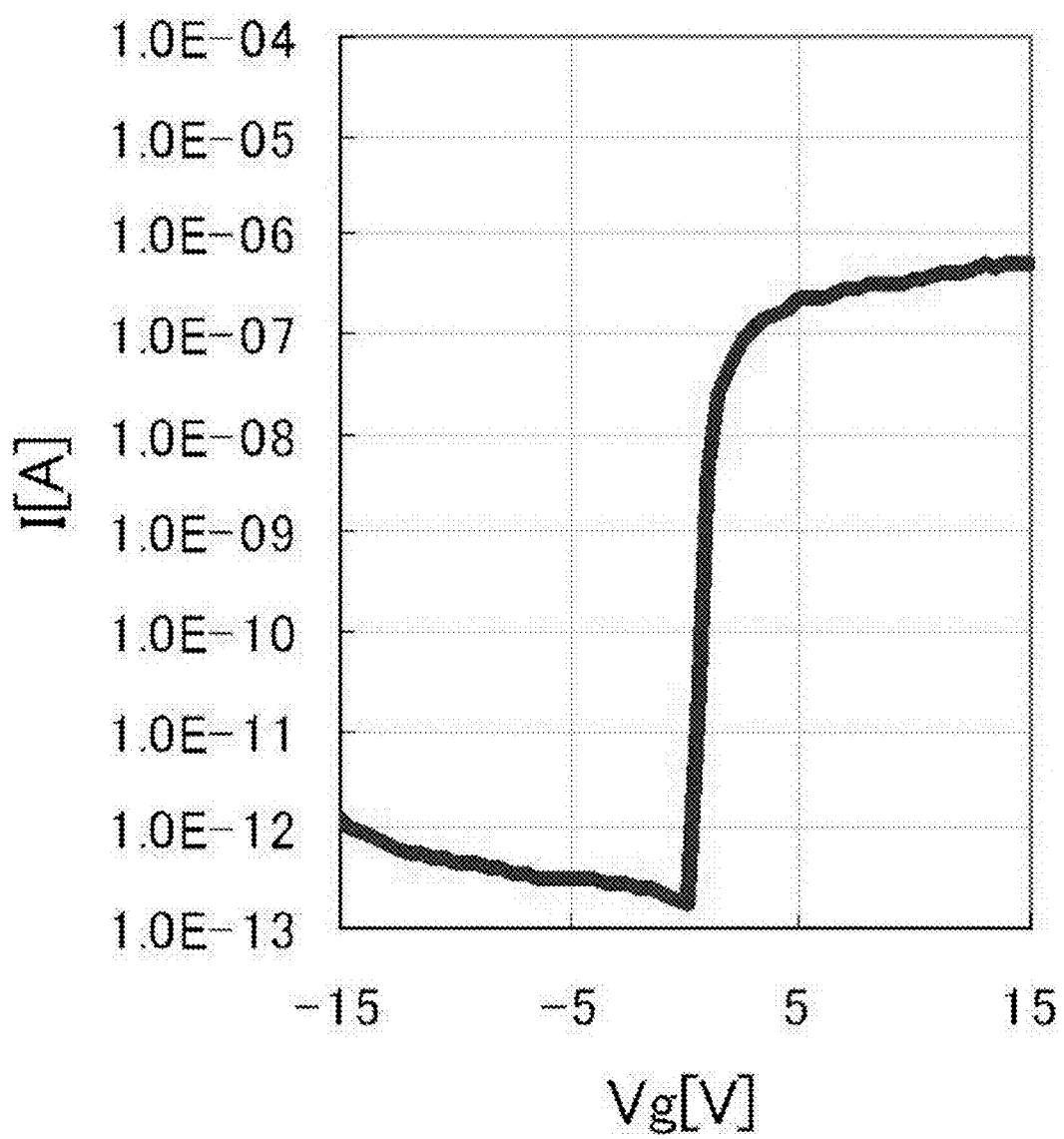
FIG. 15 is a graph showing the $V_g$-$I_d$ characteristics of a TFT produced in Example 4.
Figure 16:
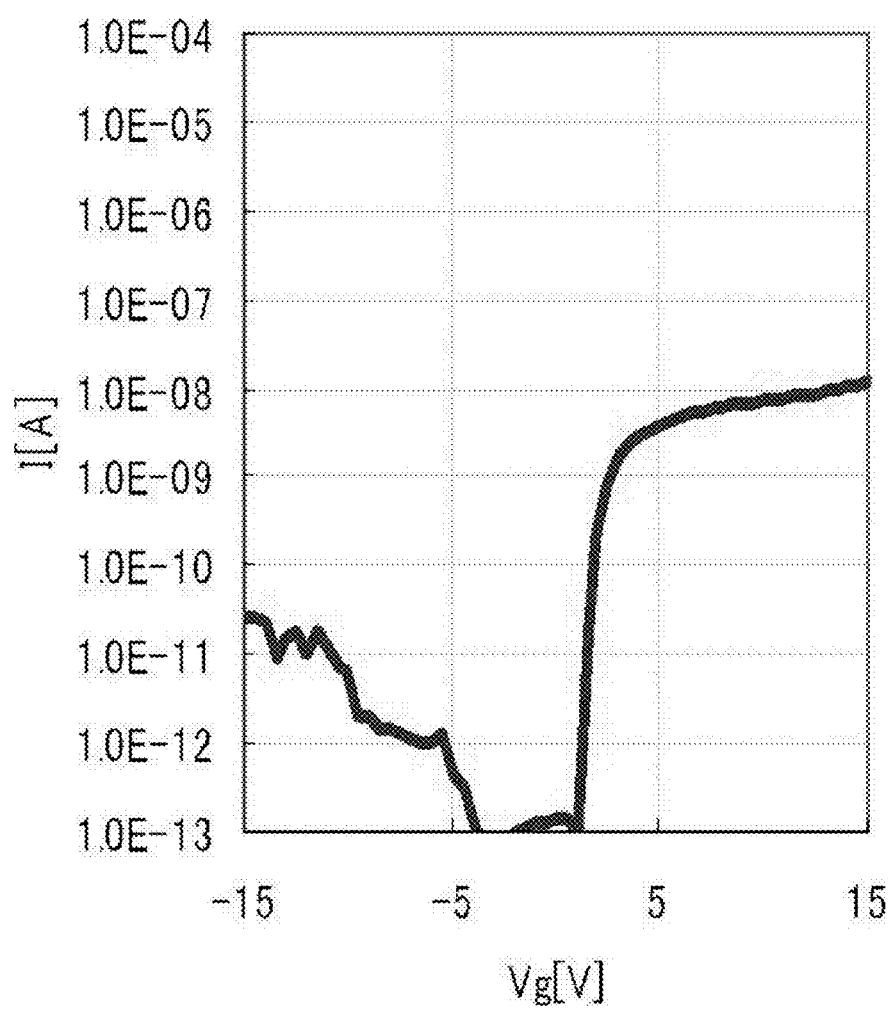
FIG. 16 is a graph showing the $V_g$-$I_d$ characteristics of a TFT produced in Comparative Example 1.

FIG. 9 is a schematic cross-section illustrating a portion of an X-ray sensor that is an embodiment of the invention, and FIG. 10 is a schematic configuration diagram illustrating electrical wiring thereof.

An X-ray sensor 300 of the present embodiment is configured by including the TFT 10 and a capacitor 310 formed above the substrate 12, a charge collection electrode 302 formed on the capacitor 310, an X-ray conversion layer 304, and an upper electrode 306. A passivation film 308 is provided on the TFT 10.

The capacitor 310 has a structure in which an insulating film 316 is interposed between a lower capacitor electrode 312 and an upper capacitor electrode 314. The upper capacitor electrode 314 is connected to either the source electrode 16 or the drain electrode 18 of the TFT 10 (the drain electrode 18 in FIG. 9) through a contact hole 318 provided to the insulating film 316.

The charge collection electrode 302 is provided above the upper capacitor electrode 314 of the capacitor 310, and is in contact with the upper capacitor electrode 314.

The X-ray conversion layer 304 is a layer formed from amorphous selenium, and is provided so as to cover the TFT 10 and the capacitor 310.

The upper electrode 306 is provided above the X-ray conversion layer 304, and is in contact with the X-ray conversion layer 304.

As illustrated in FIG. 10, the X-ray sensor 300 of the present embodiment includes plural gate lines 320 parallel to one another, and plural data lines 322 that are parallel to one another, and that intersect the gate lines 320. The gate lines 320 and the data lines 322 are electrically insulated from each other. The TFTs 10 are provided in the vicinity of the intersections between the gate lines 320 and the data lines 322.

The gate electrodes 22 of the TFTs 10 are connected to the gate lines 320, and the source electrodes 16 of the TFTs 10 are connected to the data lines 322. The drain electrodes 18 of the TFTs 10 are connected to the charge collection electrodes 302, and the charge collection electrodes 302 are connected to the capacitors 310.

In the X-ray sensor 300 of the present embodiment, X-rays are incident from the upper electrode 306 side in FIG. 9, and generate electron-hole pairs in the X-ray conversion layer 304. The capacitor 310 stores generated charge due to the upper electrode 306 applying a high electric field to the X-ray conversion layer 304, and the charge is read by sequentially scanning the TFTs 10.

Note that in the above embodiments, although a TFT with a top-gate structure was provided to the liquid crystal display apparatus 100, the organic EL display apparatus 200, and the X-ray sensor 300, the TFT is not limited thereto. The TFT structures illustrated in FIG. 2 to FIG. 4 may also be employed.

EXAMPLES

Hereinbelow, examples are described. However, the present invention is not limited by these examples in any way.

Example 1

A device for evaluation was produced as described below, and evaluation was performed. FIG. 11A illustrates a schematic plan view of a simplified TFT for evaluation, and FIG. 11B illustrates a cross-section taken along line A-A in FIG. 11A.

First, indium nitrate ($In(NO_3)_3 \cdot xH_2O$, 4N, manufactured by Kojundo Chemical Lab. Co., Ltd.) was dissolved in 2-methoxyethanol (special grade, manufactured by Wako Pure Chemical Industries, Ltd.) by stirring for 30 minutes at room temperature, whereby an indium nitrate solution having a concentration of 0.1 mol/L was produced.

A p-type Si substrate 502 provided with a thermal oxide film (100 nm) 504 was employed as a substrate, and a simplified TFT 500, employing the Si substrate 502 as a gate electrode and employing the thermal oxide film 504 as a gate insulating film, was produced.

The indium nitrate solution produced as described above was spin coated for 30 seconds at a rotation speed of 1,500 rpm on the one-square-inch p-type Si substrate provided with the thermal oxide film, and dried for 1 minute on a hot plate heated to 60° C. A precursor film for an oxide semiconductor was thereby obtained.

The obtained precursor film for an oxide semiconductor was subjected to an ultraviolet irradiation treatment under the conditions described below, whereby an oxide semiconductor film was obtained. A UV ozone cleaner (a UV253H, manufactured by Filgen, Inc.) provided with a low pressure mercury lamp was employed as the ultraviolet irradiation apparatus.

The sample was set on a glass plate having a thickness of 40 mm, and the lamp-to-sample distance was set to 10 mm. The intensity of ultraviolet radiation having a wavelength 254 nm was measured at the sample position using an ultraviolet radiation actinometer (a UV-M10 and a light receiver UV-25 manufactured by Orc Manufacturing Co., Ltd.). A maximum value of 15 mW/cm² was reached 3 minutes after turning on the lamp. The intensity of ultraviolet radiation having a wavelength 254 nm in the examples and comparative examples below was also measured using the ultraviolet radiation actinometer (a UV-M10 and a light receiver UV-25 manufactured by Orc Manufacturing Co., Ltd.).

After allowing nitrogen to flow in an ultraviolet irradiation treatment chamber at 6 L/min for 10 minutes, irradiation with ultraviolet radiation was performed for 90 minutes. Nitrogen flow in the ultraviolet irradiation treatment chamber was kept at 6 L/min all times during the ultraviolet irradiation. The substrate temperature during the ultraviolet irradiation treatment (the ultimate temperature of the substrate during the ultraviolet irradiation treatment; the same applies below) was indicated to be 135° C. when monitored using a thermo-label.

Source and drain electrodes 510, 512 were formed by vapor deposition as films on the oxide semiconductor film 506 obtained as described above, respectively. Film formation of the source and drain electrodes 510, 512 was performed by pattern film formation using a metal mask, and Ti films each having a thickness of 50 nm were formed, respectively. The sizes of both of the source and drain electrodes 510, 512 were set to 1 mm², respectively, and an inter-electrode distance was set to 0.2 mm. The simplified TFT 500 was thereby produced.

Examples 2 to 4, and Comparative Examples 1 and 2

Simplified TFTs were produced in the same manner as in Example 1, except that the drying temperature of the film coating of the indium nitrate solution of Example 1 was changed to the temperatures shown in the following Table 1.

TABLE 1

| | Drying Temperature (° C.) |
|---|---|
| Example 1 | 60 |
| Example 2 | 35 |
| Example 3 | 90 |
| Example 4 | 100 |
| Comparative Example 1 | 140 |
| Comparative Example 2 | No drying process (room temperature 25° C.) |

Evaluation
Transistor Characteristics

The transistor characteristics ($V_g$-$I_d$ characteristics) were measured using a semiconductor parameter analyzer 4156C (manufactured by Agilent Technologies) for the simplified TFTs obtained above.

Measurement of the $V_g$-$I_d$ characteristics was performed by changing the gate voltage ($V_g$) across a range of from −15V to +15V with the drain voltage ($V_d$) fixed at +1V, and measuring the drain current ($I_d$) for each gate voltage ($V_g$). Note that measurement of the transistor characteristics in the examples and comparative examples described below was also performed in the same manner as described above.

Figure 17:
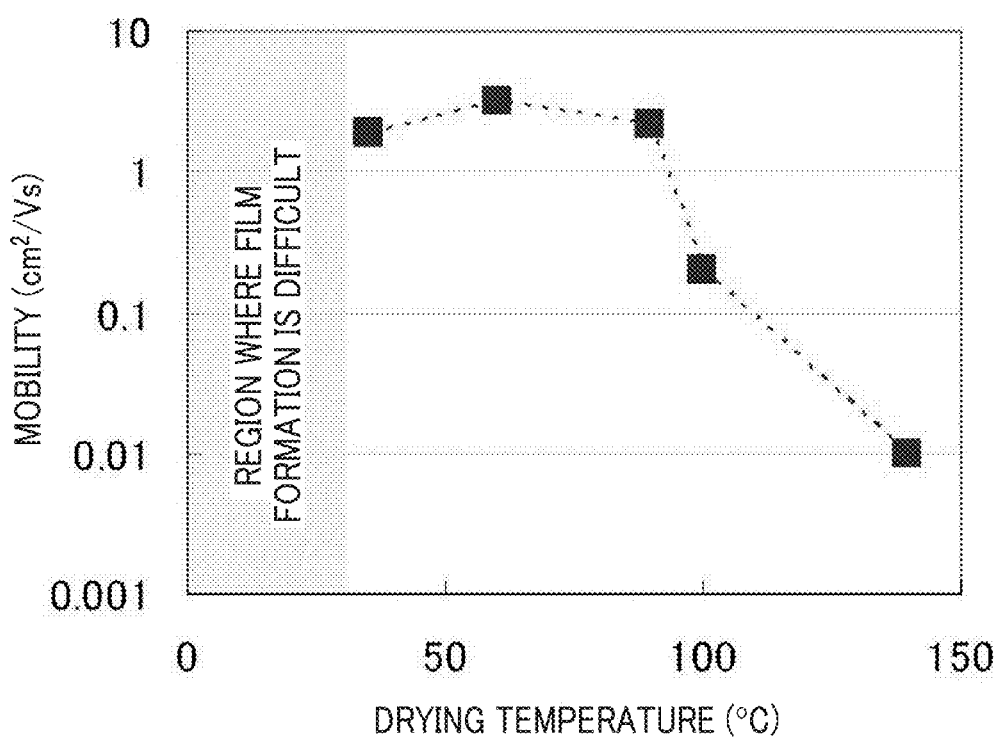
FIG. 17 is a diagram showing a relationship between drying temperature during formation of an oxide semiconductor layer of a TFT, and mobility in examples and comparative examples.

The $V_g$-$I_d$ characteristics of Example 1 to Example 4 and Comparative Example 1 are plotted in FIG. 12 to FIG. 16, and the relationship between the drying temperature during the formation of the oxide semiconductor layer, and the mobility is illustrated in FIG. 17. Note that for Comparative Example 2, the film coating was repelled, forming a uniform film was problematic, and transistor evaluation was not able to be performed. The results are shown in the following Table 2.

TABLE 2

| | Drying Temperature (° C.) | Linear Mobility (cm²/Vs) | Threshold Voltage (V) |
|---|---|---|---|
| Example 1 | 60 | 3.2 | 2.4 |
| Example 2 | 35 | 1.9 | 5.8 |
| Example 3 | 90 | 2.2 | 3.8 |
| Example 4 | 100 | 0.2 | 3.2 |
| Comparative Example 1 | 140 | 0.01 | 8.2 |
| Comparative Example 2 | No drying process | — | — |

Performing drying with a substrate temperature within a range of from 35° C. to 100° C. in the drying process enabled a film to be formed easily, and excellent transistor characteristics were confirmed in which the mobility exceeded 0.1 cm²/Vs. In Example 1 to Example 3, in which drying was performed with a substrate temperature within a range of from 35° C. to 90° C. in the drying process, excellent transistor behavior was confirmed in which the mobility exceeded 1 cm²/Vs.

X-Ray Photoelectron Spectroscopy Analysis

X-ray photoelectron spectroscopy (XPS) analysis was performed for each of the oxide semiconductor films produced in Example 1 (drying temperature 60° C.), Example 2 (drying temperature 35° C.), Example 3 (drying temperature 90° C.), Example 4 (drying temperature 100° C.), and Comparative Example 1 (drying temperature 140° C.). The measurement apparatus was a Quantera SXM manufactured by ULVAC-PHI Inc. As the measurement conditions, the X-ray source was monochrome AlKα (100 μm φ, 25 W, 15 kV), the analyzed diameter was 100 μm φ, and a photoelectron take-off angle of 45° C.

Regarding the N 1s peaks, a component derived from $NO_2$ is detected in the vicinity of from approximately 402 eV to approximately 405 eV, and a component derived from $NO_3$ is detected in the vicinity of from 406 eV to 408 eV. Note that X-ray photoelectron spectroscopy analysis similar to that described above was performed for the examples and for comparative examples below.

Figure 18:
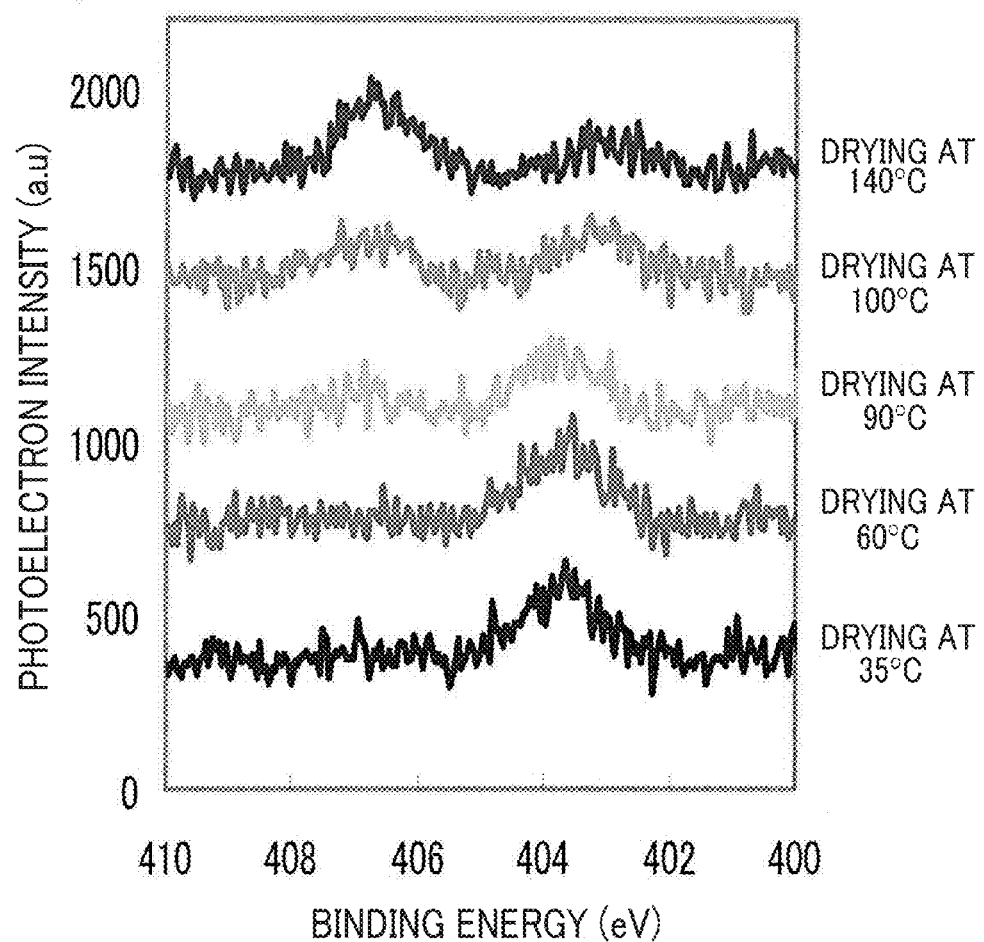
FIG. 18 is a diagram showing XPS spectra for oxide semiconductor layers manufactured in Examples 1 to 4 and Comparative Example 1.
Figure 19:
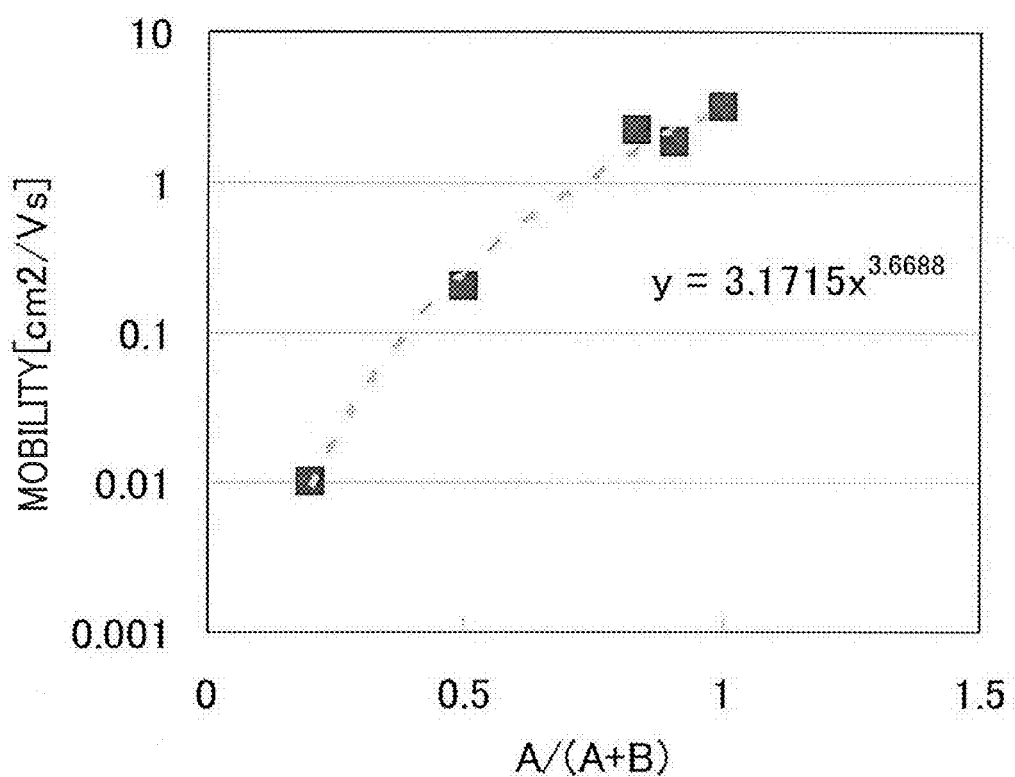
FIG. 19 is a diagram showing a relationship between ratio A/(A+B) of peak areas in an XPS spectrum corresponding to binding energies, and mobility for oxide semiconductor layers manufactured in Examples 1 to 4 and Comparative Example 1.

The results of the X-ray photoelectron spectroscopy (XPS) analysis are plotted in FIG. 18, and the peak area ratios A/(A+B), after smoothing the obtained spectra, are shown in Table 3. The relationship between the obtained peak area ratio and the mobility is plotted in FIG. 19. The peak energy intensity attributed to a nitrogen 1s electron is obtained by peak separation, and A represents the peak area of a component having a peak position of a binding energy within a range of from 402 eV to 405 eV, and B represents the peak area of a component having a peak position of a binding energy within a range of from 406 eV to 408 eV. According to an approximated curve based on a power approximation, a thin-film transistor exhibiting excellent carrier mobility with a mobility of 0.1 or higher was obtained when A/(A+B) is 0.39 or larger, and the mobility is 1 or higher when A/(A+B) is 0.73 or larger, this being more preferable.

TABLE 3

| | A/(A + B) |
|---|---|
| Example 1 | 1 |
| Example 2 | 0.91 |
| Example 3 | 0.83 |
| Example 4 | 0.50 |
| Comparative Example 1 | 0.2 |

Dependency On Ultraviolet Radiation Intensity and Atmosphere During Ultraviolet Irradiation A simplified TFT was produced using a p-type Si substrate provided with a thermal oxide film as a substrate, and using the thermal oxide film as a gate insulating film. The indium nitrate solution produced as described above was spin coated for 30 seconds at a rotation speed of 1,500 rpm onto the one-square-inch p-type Si substrate provided with the thermal oxide film, and then was dried for 1 minute on a hot plate heated to 60° C.

The obtained precursor thin-film for an oxide semiconductor was subjected to an ultraviolet irradiation treatment, whereby a treated film was obtained. A UV ozone cleaner (a UV253H, manufactured by Filgen, Inc.) provided with a low pressure mercury lamp was employed as the ultraviolet irradiation apparatus. The sample was set on a glass plate having a thickness of 40 mm, and the duration of ultraviolet irradiation was set to 90 minutes. The lamp-to-sample distance and the gas flow during the ultraviolet irradiation were set to the conditions shown in Table 4 together with the ultraviolet irradiation intensities reached 3 minutes after the lamp was turned on under each set of conditions. Similarly to in the measurement of the ultraviolet radiation intensity in Example 1, the ultraviolet irradiation intensities in Table 4 are ultraviolet irradiation intensities measured at a wavelength of 254 nm.

TABLE 4

| | Lamp-to-Sample Distance | Gas Flow During Ultraviolet Irradiation | Ultraviolet Radiation Intensity 3 Minutes After Turning On Lamp | Substrate Temperature |
|---|---|---|---|---|
| Comparative Example 3 | 50 mm | $N_2$ 100% | 8.5 | 100° C. |
| Comparative Example 4 | 10 mm | $N_2$ 80% $O_2$ 20% | 9.5 | 100° C. |
| Example 5 | 5 mm | $N_2$ 80% $O_2$ 20% | 11.0 | 120° C. |

Transistor behavior was not confirmed in Comparative Examples 3 or 4, and insulator behavior was observed. In contrast, for Example 5, excellent transistor operation was confirmed with a linear mobility of 1.3, and a threshold voltage of 4.1.

Table 5 shows the linear mobility and the values of A/(A+B) obtained by an X-ray photoelectron spectroscopy (XPS) analysis of the treated films for Comparative Examples 3 and 4, and Example 5. It is evident that for Comparative Examples 3 and 4, since the value of A/(A+B) is small, decomposition of the nitrate by ultraviolet radiation did not occur sufficiently. In contrast, Example 5 exhibited a high value for A/(A+B), and excellent transistor characteristics were evidently obtained as a result.

TABLE 5

| | A/(A + B) | Linear Mobility ($cm^2$/Vs) |
|---|---|---|
| Comparative Example 3 | 0.16 | — |
| Comparative Example 4 | 0.19 | — |
| Example 5 | 0.77 | 1.3 |

Comparative Examples 5 to 9

Precursor Films not Subjected to Ultraviolet Irradiation

A simplified TFT was produced using the indium nitrate solution employed in Example 1, using a p-type Si substrate provided with a thermal oxide layer as a substrate, and using the thermal oxide film as a gate insulating film. The produced indium nitrate solution was spin coated for 30 seconds at a rotation speed of 1,500 rpm on the one-square-inch p-type Si substrate provided with the thermal oxide film, and was then dried for 1 minute on a hot plate, whereby a precursor film for an oxide semiconductor was obtained. During the drying, the temperature of the top plate of the hot plate was set to 35° C. (Comparative Example 5), 60° C. (Comparative Example 6), 90° C. (Comparative Example 7), 100° C. (Comparative Example 8), or 140° C. (Comparative Example 9).

Source and drain electrodes were formed by vapor deposition as films on the precursor film for an oxide semiconductor obtained as described above. Film formation of the source and drain electrodes was carried out by a pattern film formation using a metal mask, and Ti films each having a thickness of 50 nm were formed, respectively. The sizes of both of the source and drain electrodes were set to 1 $mm^2$, respectively, and the inter-electrode distance was set to 0.2 mm. Simplified TFTs were thereby produced.

For Comparative Examples 5 to 9, transistor operation was not confirmed, and insulating behavior was observed.

When XPS analysis was performed on Comparative Examples 5 to 9 using similar conditions as for Example 1, only a peak derived from $NO_3$ was confirmed, and A/(A+B) was 0.

Comparative Examples 10, 11

Heating Substrate without Ultraviolet Irradiation

A simplified TFT was produced using the indium nitrate solution employed in Example 1, using a p-type Si substrate provided with a thermal oxide film as a substrate, and using the thermal oxide film as a gate insulating film. The indium nitrate solution produced was spin coated for 30 seconds with a rotation speed of 1,500 rpm onto the one-square-inch p-type Si substrate provided with a thermal oxide film, and then dried for 1 minute on a hot plate heated to 60° C. A precursor film for an oxide semiconductor was thereby obtained.

The obtained precursor film for an oxide semiconductor was subjected to an annealing treatment using a hot plate. The temperature of the top plate of the hot plate was set to 140° C. (Comparative Example 10), or 200° C. (Comparative Example 11), and a treated film was obtained by annealing for 1 hour.

Source and drain electrodes were formed by vapor deposition as films on the obtained treated film. Film formation of the source and drain electrodes was carried out by a pattern film formation using a metal mask, and Ti films each having a thickness of 50 nm were formed, respectively. The sizes of both of the source and drain electrodes were set to 1 mm$^2$, respectively, and an inter-electrode distance was set to 0.2 mm. A simplified TFT was thereby produced.

For Comparative Examples 10 and 11, transistor operation was not confirmed, and insulating behavior was observed. For Comparative Example 10, only a peak derived from $NO_3$ was confirmed, A/(A+B) was 0, and the decomposition of the nitrate did not occur sufficiently. For Comparative Example 11, neither a peak derived from $NO_2$, nor a peak derived from $NO_3$ was confirmed.

Example 6A

Methanol is Used as Solvent

First, indium nitrate was dissolved in methanol (special grade, manufactured by Wako Pure Chemical Industries, Ltd.) by stirring for 30 minutes at room temperature, whereby an indium nitrate solution having a concentration of 0.1 mol/L was produced.

A simplified TFT was produced using a p-type Si substrate provided with a thermal oxide film as a substrate, and using the thermal oxide film as a gate insulating film. The produced indium nitrate solution was spin coated for 5 seconds at a rotation speed of 5,000 rpm onto the one-square-inch p-type Si substrate provided with the thermal oxide film, and then dried for 1 minute on a hot plate heated to 60° C. A precursor film for an oxide semiconductor was thereby obtained.

The obtained precursor film for an oxide semiconductor was subjected to an ultraviolet irradiation treatment under the conditions described below, whereby an oxide semiconductor film was obtained. A UV ozone cleaner (a UV253H, manufactured by Filgen, Inc.) provided with a low pressure mercury lamp was employed as the ultraviolet radiation irradiation apparatus.

The sample was set on a glass plate having a thickness of 40 mm, and the lamp-to-sample distance was set to 10 mm. After allowing nitrogen to flow in an ultraviolet irradiation treatment chamber at 6 L/min for 10 minutes, irradiation with ultraviolet radiation was carried out for 90 minutes. Nitrogen flow was kept at 6 L/min all times during the ultraviolet irradiation. The intensity of ultraviolet radiation having a wavelength 254 nm at the sample position was measured using an ultraviolet radiation actinometer (a UV-M10 and a light receiver UV-25 manufactured by Orc Manufacturing Co., Ltd.). As in Example 1, a maximum value of 15 mW/cm$^2$ was reached 3 minutes after turning on the lamp. The substrate temperature during the ultraviolet irradiation treatment was also similar to in Example 1.

Source and drain electrodes were formed by vapor deposition as films on the oxide semiconductor film obtained as described above, respectively. Film formation of the source and drain electrodes was performed by pattern film formation using a metal mask, and Ti films each having a thickness of 50 nm were formed, respectively. The sizes of the source and drain electrodes were set to 1 mm$^2$, respectively, and the inter-electrode distance was set to 0.2 mm. A simplified TFT was thereby produced. The value of A/(A+B) obtained by X-ray photoelectron spectroscopy (XPS) analysis of the oxide semiconductor film was 0.90.

Example 6B

N,N-dimethylacetamide is Used as Solvent

First, indium nitrate was dissolved in N,N-dimethylacetamide (Wako special grade, manufactured by Wako Pure Chemical Industries, Ltd.) by stirring for 30 minutes at room temperature, and an indium nitrate solution having a concentration of 0.2 mol/L was produced.

A simplified TFT was produced using a p-type Si substrate provided with a thermal oxide film as a substrate, and using the thermal oxide film as a gate insulating film. The produced indium nitrate solution was spin coated for 30 seconds at a rotation speed of 1,500 rpm onto the one-square-inch p-type Si substrate provided with the thermal oxide film, and then dried for 1 minute on a hot plate heated to 60° C. A precursor film for an oxide semiconductor was thereby obtained.

The obtained precursor film for an oxide semiconductor was subjected to an ultraviolet irradiation treatment under the conditions described below, whereby an oxide semiconductor film was obtained. A UV ozone cleaner (a UV253H, manufactured by Filgen, Inc.) provided with a low pressure mercury lamp was employed as the ultraviolet radiation irradiation apparatus.

The sample was set on a glass plate having a thickness of 40 mm, and the lamp-to-sample distance was set to 10 mm. After allowing nitrogen to flow in an ultraviolet irradiation treatment chamber at 6 L/min for 10 minutes, irradiation with ultraviolet radiation was performed for 90 minutes. Nitrogen flow was kept at 6 L/min all times during the ultraviolet irradiation. The intensity of ultraviolet radiation having a wavelength 254 nm at the sample position was measured using an ultraviolet radiation actinometer (a UV-M10 and a light receiver UV-25 manufactured by Orc Manufacturing Co., Ltd.). As in Example 1, a maximum value of 15 mW/cm$^2$ was reached 3 minutes after turning on the lamp. The substrate temperature during the ultraviolet irradiation treatment was also similar to in Example 1.

Source and drain electrodes were formed by vapor deposition as films on the oxide semiconductor film obtained above. Film formation of the source and drain electrodes was performed by pattern film formation using a metal mask, and Ti films having a thickness of 50 nm were formed. The sizes of both of the source and drain electrodes were 1 mm$^2$, respectively, and the inter-electrode distance was set to 0.2 mm. A simplified TFT was thereby produced. The value of A/(A+B) obtained by X-ray photoelectron spectroscopy (XPS) analysis of the oxide semiconductor film was 0.87.

The $V_g$-$I_d$ characteristics were evaluated for Examples 6A, 6B in the same manner as in Example 1. As a result, similarly to Example 1, excellent transistor characteristics were obtained with an electronic mobility of from 2 to 3 cm$^2$/Vs.

Example 7

Composition Including Zinc

First, indium nitrate and zinc acetate (Zn(CH$_3$CO$_2$)$_2$.2H$_2$O, manufactured by Kojundo Chemical Lab. Co., Ltd.) were dissolved in methoxyethanol by stirring for 30 minutes at room temperature, whereby a mixed indium nitrate/zinc acetate solution was produced with an indium nitrate concentration of 0.08 mol/L and a zinc acetate concentration of 0.02 mol/L.

A simplified TFT was produced using a p-type Si substrate provided with a thermal oxide film as a substrate, and using the thermal oxide film as a gate insulating film. The produced mixed solution was spin coated for 30 seconds at a rotation speed of 1500 rpm onto the one-square-inch p-type Si substrate provided with the thermal oxide film, and then dried for 1 minute on a hot plate heated to 60° C. A precursor film for an oxide semiconductor was thereby obtained.

The obtained precursor film for an oxide semiconductor was subjected to an ultraviolet irradiation treatment under the conditions described below, whereby an oxide semiconductor film was obtained. A UV ozone cleaner (a UV253H, manufactured by Filgen, Inc.) provided with a low pressure mercury lamp was employed as the ultraviolet irradiation apparatus.

The sample was set on a glass plate having a thickness of 40 mm, and the lamp-to-sample distance was set to 10 mm. After allowing nitrogen to flow in an ultraviolet irradiation treatment chamber at 6 L/min for 10 minutes, irradiation with ultraviolet radiation was performed for 90 minutes. Nitrogen flow was kept at 6 L/min all times during the ultraviolet irradiation. The intensity of ultraviolet radiation having a wavelength 254 nm at the sample position was measured using an ultraviolet radiation actinometer (a UV-M10 and a light receiver UV-25 manufactured by Orc Manufacturing Co., Ltd.). As in Example 1, a maximum value of 15 mW/cm$^2$ was reached 3 minutes after turning on the lamp. The substrate temperature during the ultraviolet irradiation treatment was also similar to in Example 1.

Source and drain electrodes 510, 512 were formed by vapor deposition as films on the oxide semiconductor film 506 obtained as described above. Film formation of the source and drain electrodes 510, 512 was performed by pattern film formation using a metal mask, and Ti films having a thickness of 50 nm were formed, respectively. The sizes of both of the source and drain electrodes 510, 512 were set to 1 mm$^2$, respectively, and the inter-electrode distance was set to 0.2 mm. A simplified TFT 500 was thereby produced. The value of A/(A+B) obtained by X-ray photoelectron spectroscopy (XPS) analysis of the oxide semiconductor film was 0.80.

Excellent transistor characteristics were thereby obtained, with an electronic mobility of 1.4 cm$^2$/Vs.

Example 8

Composition Including Gallium and Zinc

First, indium nitrate, zinc acetate, and gallium nitrate (Ga(NO$_3$)$_3$.xH$_2$O, 5N, manufactured by Kojundo Chemical Lab. Co., Ltd.) were dissolved in methoxyethanol by stirring for 30 minutes at room temperature, whereby a mixed indium nitrate/zinc acetate/gallium nitrate solution was produced with an indium nitrate concentration of 0.08 mol/L, a zinc acetate concentration of 0.01 mol/L, and a gallium nitrate concentration of 0.01 mol/L.

A simplified TFT was produced using a p-type Si substrate provided with a thermal oxide film as a substrate, and using the thermal oxide film as a gate insulating film. The produced mixed solution was spin coated for 30 seconds at a rotation speed of 1500 rpm onto the one-square-inch p-type Si substrate provided with the thermal oxide film, and then dried for 1 minute on a hot plate heated to 60° C. A precursor film for an oxide semiconductor was thereby obtained.

The obtained precursor film for an oxide semiconductor was subjected to an ultraviolet irradiation treatment under the conditions described below, whereby an oxide semiconductor film was obtained. A UV ozone cleaner (a UV253H, manufactured by Filgen, Inc.) provided with a low pressure mercury lamp was employed as the ultraviolet irradiation apparatus.

The sample was set on a glass plate having a thickness of 40 mm, and the lamp-to-sample distance was set to 10 mm. After allowing nitrogen to flow in the ultraviolet irradiation treatment chamber at 6 L/min for 10 minutes, irradiation with ultraviolet radiation was performed for 90 minutes. Nitrogen flow was kept at 6 L/min all times during the ultraviolet irradiation. The intensity of ultraviolet radiation having a wavelength 254 nm at the sample position was measured using an ultraviolet radiation actinometer (a UV-M10 and a light receiver UV-25 manufactured by Orc Manufacturing Co., Ltd.). As in Example 1, a maximum value of 15 mW/cm$^2$ was reached 3 minutes after turning on the lamp. The substrate temperature during the ultraviolet irradiation treatment was also similar to in Example 1.

Source and drain electrodes 510, 512 were formed by vapor deposition as films on the oxide semiconductor film 506 obtained above. Film formation of the source and drain electrodes 510, 512 was performed by pattern film formation using a metal mask, and Ti films each having a thickness of 50 nm were formed. The sizes of both of the source and drain electrodes 510, 512 were set to 1 mm$_2$, respectively, and the inter-electrode distance was set to 0.2 mm. A simplified TFT 500 was thereby produced. The value of A/(A+B) obtained by X-ray photoelectron spectroscopy (XPS) analysis of the oxide semiconductor film was 0.81.

Excellent transistor characteristics were thereby obtained, with an electronic mobility of 1.2 cm$^2$/Vs.

Although explanation regarding the metal oxide film has mainly focused on the oxide semiconductor film and the manufacturing method for the same in the embodiments and examples above, the metal oxide film and the manufacturing method for the same are not limited to oxide semiconductor films. Effective application can be made to other oxide films (conductive films, and insulating films). In particular, application may be suitably made to a conductive film since a conductive film having excellent electrical conductivity can be obtained thereby.

Reference Example

Figure 20:
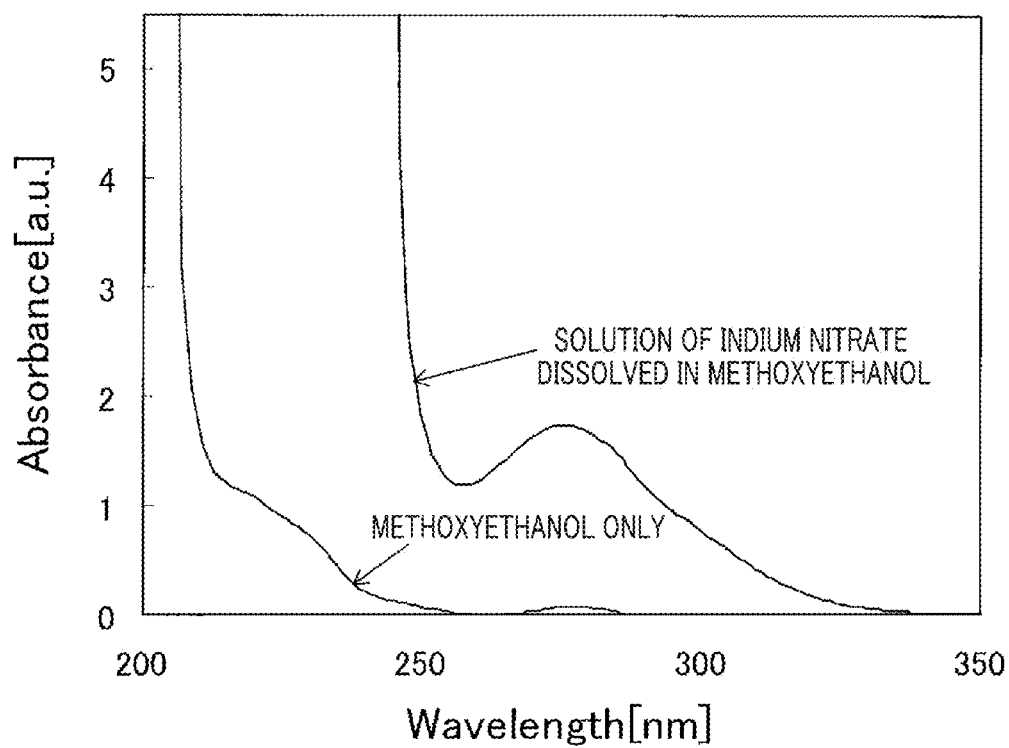
FIG. 20 is a diagram showing an ultraviolet absorption spectrum of a solution of a reference example.

FIG. 20 illustrates an ultraviolet absorption spectrum of a solution of indium nitrate dissolved in 2-methoxyethanol. A double beam spectrophotometer U-2910 (manufactured by Hitachi High-Technologies Corporation) was employed for this measurement. An ultraviolet absorption spectrum of 2-methoxyethanol is also plotted for comparison. 2-Methoxyethanol does not absorb the light in the wavelength range around 254 nm, which is the main wavelength of a low pressure mercury lamp. In contrast, the solution of indium nitrate dissolved in 2-methoxyethanol strongly absorbs the light in the wavelength range around 254 nm, and it is apparent that deep ultraviolet light may influence the film directly.

Note that the disclosure of Japanese Patent Application No. 2013-057281, filed on Mar. 19, 2013, and the disclosure of Japanese Patent Application No. 2014-14679, filed on Jan. 29, 2014, are incorporated in their entirety by reference herein. All cited documents, patent applications, and technical standards mentioned in the present specification are incorporated by reference in the present specification to the same extent as if the individual cited document, patent application, or technical standard was specifically and individually indicated to be incorporated by reference.

What is claimed is:

1. A metal oxide film, comprising a component having a peak position, in an XPS spectrum of the metal oxide film, obtained by an X-ray photoelectron spectroscopy analysis, within a range corresponding to a binding energy of from 402 eV to 405 eV, the metal oxide film satisfying a relationship represented by the following Equation (1) when an intensity of a peak energy attributed to a nitrogen 1s electron is obtained by peak separation:

$$A/(A+B) \geq 0.39 \qquad \text{Equation (1)}$$

wherein, in Equation (1), A represents a peak area of the component having a peak position within a range corresponding to a binding energy of from 402 eV to 405 eV, and B represents a peak area of a component having a peak position within a range corresponding to a binding energy of from 406 eV to 408 eV.

2. The metal oxide film according to claim 1, which satisfies a relationship represented by the following Equation (2) when the intensity of the peak energy attributed to a nitrogen 1s electron is obtained by peak separation in the XPS spectrum of the metal oxide film, obtained by an X-ray photoelectron spectroscopy analysis:

$$A/(A+B) \geq 0.73 \qquad \text{Equation (2)}$$

wherein, in Equation (2), A represents the peak area of the component having a peak position within a range corresponding to a binding energy of from 402 eV to 405 eV, and B represents the peak area of the component having a peak position within a range corresponding to a binding energy of from 406 eV to 408 eV.

3. The metal oxide film according to claim 1, comprising indium.

4. The metal oxide film according to claim 3, comprising:
   indium; and
   at least one selected from the group consisting of Zn, Sn, Ga and Al.

5. The metal oxide film according to claim 3, wherein a content of indium is 50 atom % or higher with respect to a total content of metal elements included in the metal oxide film.

6. A conductive oxide film, comprising the metal oxide film according to claim 1.

7. An oxide semiconductor film, comprising the metal oxide film according to claim 1.

8. A thin-film transistor, comprising:
   an active layer comprising the oxide semiconductor film according to claim 7;
   a source electrode;
   a drain electrode;
   a gate insulating film; and
   a gate electrode.

9. A display apparatus, comprising the thin-film transistor according to claim 8.

10. An image sensor, comprising the thin-film transistor according to claim 8.

11. An X-ray sensor, comprising the thin-film transistor according to claim 8.

* * * * *